United States Patent
Wu

(10) Patent No.: US 11,411,548 B2
(45) Date of Patent: Aug. 9, 2022

(54) BULK ACOUSTIC WAVE RESONATOR AND BULK ACOUSTIC WAVE FILTER

(71) Applicant: Newsonic Technologies, Guangdong (CN)

(72) Inventor: Gengjiang Wu, Guangdong (CN)

(73) Assignee: Newsonic Technologies, Guangdong (CN)

( * ) Notice: Subject to any disclaimer, the term of this patent is extended or adjusted under 35 U.S.C. 154(b) by 0 days.

(21) Appl. No.: 17/573,206

(22) Filed: Jan. 11, 2022

(65) Prior Publication Data

US 2022/0131520 A1  Apr. 28, 2022

(51) Int. Cl.
  *H03H 9/13*  (2006.01)
  *H03H 9/17*  (2006.01)
  *H03H 9/56*  (2006.01)

(52) U.S. Cl.
  CPC ............ *H03H 9/132* (2013.01); *H03H 9/173* (2013.01); *H03H 9/564* (2013.01)

(58) Field of Classification Search
  CPC ......... H03H 9/132; H03H 9/173; H03H 9/564
  USPC ........................................ 333/133, 187, 188
  See application file for complete search history.

(56) References Cited

U.S. PATENT DOCUMENTS

2016/0126930 A1*  5/2016  Zou .................... H03H 9/175
                                                          333/187

FOREIGN PATENT DOCUMENTS

CN    111010128 A    4/2020
CN    111355466 A    6/2020

* cited by examiner

*Primary Examiner* — Rakesh B Patel
*Assistant Examiner* — Jorge L Salazar, Jr.
(74) *Attorney, Agent, or Firm* — Leason Ellis LLP

(57) ABSTRACT

A bulk acoustic wave resonator and a bulk acoustic wave filter are provided. The bulk acoustic wave resonator includes: a piezoelectric layer; an electrode layer located at both sides of the piezoelectric layer; and an electrode edge frame structure located at an edge of the electrode layer and located at one side of the electrode layer away from the piezoelectric layer. The electrode edge frame structure includes a laminated structure, the laminated structure includes an edge convex layer and a passivation layer laminated in a longitudinal direction, and the passivation layer is located at one side of the edge convex layer away from the piezoelectric layer; in a transverse direction, the laminated structure includes a cantilever member and a convex structure connected with each other; a cantilever gap is arranged between the cantilever member and at least one of the piezoelectric layer and the electrode layer.

19 Claims, 13 Drawing Sheets

BULK ACOUSTIC WAVE RESONATOR AND BULK ACOUSTIC WAVE FILTER

TECHNICAL FIELD

Embodiments of the present disclosure relate to a bulk acoustic wave resonator and a bulk acoustic wave filter.

BACKGROUND

A bulk acoustic wave (BAW) filter usually is manufactured by forming a lower electrode, a piezoelectric layer and an upper electrode, sequentially, on a base substrate, thus forming a resonator structure with piezoelectric characteristics on the base substrate. In order to improve an insertion loss performance of the BAW filter, a structure of the BAW filter is continuously optimized to improve a quality factor (Q value) and a parallel resonance impedance (Rp value) of the resonator.

SUMMARY

At least one embodiment according to the present disclosure provides a bulk acoustic wave resonator, including: a piezoelectric layer; an electrode layer located at both sides of the piezoelectric layer; and an electrode edge frame structure located at an edge of the electrode layer and located at one side of the electrode layer away from the piezoelectric layer, wherein a direction perpendicular to the piezoelectric layer is a first direction, and a direction that is parallel to the piezoelectric layer and is perpendicular to the edge of the electrode layer where the electrode edge frame structure is arranged is a second direction; the electrode edge frame structure includes a laminated structure, the laminated structure includes an edge convex layer and a passivation layer which are laminated in the first direction, and the passivation layer is located at one side of the edge convex layer away from the piezoelectric layer; in the second direction, the laminated structure includes a cantilever member and a convex structure which are connected with each other, and the cantilever member is located at one side of the convex structure away from a central portion of the electrode layer; a cantilever gap is arranged between the cantilever member and at least one of the piezoelectric layer and the electrode layer; and in the second direction, an inner edge of the edge convex layer is located at an inner side of the edge of the electrode layer, and the passivation layer covers the edge convex layer to form a first step structure at the inner edge of the edge convex layer, and the convex structure is located between an inner edge of the cantilever gap and the first step structure of the passivation layer.

In some examples, the cantilever member extends outwardly beyond the edge of the electrode layer to form the cantilever gap between the cantilever member and the piezoelectric layer.

In some examples, an outer edge of the edge convex layer is aligned with the edge of the electrode layer in the first direction, and the passivation layer extends outwardly beyond the edge of the electrode layer to form the cantilever gap between a portion of the passivation layer beyond the edge of the electrode layer and the piezoelectric layer.

In some examples, both the edge convex layer and the passivation layer extend outwardly beyond the edge of the electrode layer to form the cantilever gap between a portion of the edge convex layer beyond the edge of the electrode layer and the piezoelectric layer.

In some examples, a second step structure is formed between an outer edge of the edge convex layer and the inner edge of the edge convex layer, so that a first gap is formed between the electrode layer and at least a portion of the edge convex layer located between the outer edge of the edge convex layer and the second step structure, and the first gap is at least a portion of the cantilever gap.

In some examples, the outer edge of the edge convex layer and an outer edge of the passivation layer are aligned with the edge of the electrode layer in the first direction.

In some examples, the edge convex layer and the passivation layer extend outwardly beyond the edge of the electrode layer, so that a second gap is formed between a portion of the edge convex layer beyond the edge of the electrode layer and the piezoelectric layer, the first gap is connected with the second gap, and the second gap is a portion of the cantilever gap.

In some examples, the laminated structure further includes a dielectric layer between the edge convex layer and the electrode layer, and the dielectric layer is located at least in the convex structure of the laminated structure.

In some examples, the dielectric layer, the edge convex layer and the passivation layer all extend outwardly beyond the edge of the electrode layer to form the cantilever gap between a portion of the dielectric layer beyond the edge of the electrode layer and the piezoelectric layer.

In some examples, both the edge convex layer and the passivation layer extend outwardly beyond the edge of the electrode layer, and an outer edge of the dielectric layer and the edge of the electrode layer are aligned in the first direction to form the cantilever gap between a portion of the edge convex layer beyond the edge of the electrode layer and the piezoelectric layer.

In some examples, the passivation layer extends outwardly beyond the edge of the electrode layer, and an outer edge of the dielectric layer and an outer edge of the edge convex layer are aligned with the edge of the electrode layer in the first direction to form the cantilever gap between a portion of the passivation layer beyond the edge of the electrode layer and the piezoelectric layer.

In some examples, a second step structure is formed between an outer edge of the edge convex layer and the inner edge of the edge convex layer, and an outer edge of the dielectric layer and the edge of the electrode layer are aligned in the first direction to form a first gap between the dielectric layer and at least a portion of the edge convex layer located between the outer edge of the edge convex layer and the second step structure, and the first gap is at least a portion of the cantilever gap.

In some examples, the edge convex layer and the passivation layer extend outwardly beyond the edge of the electrode layer to form a second gap between a portion of the edge convex layer beyond the edge of the electrode layer and the piezoelectric layer, the second gap is connected with the first gap and the second gap is a portion of the cantilever gap.

In some examples, the dielectric layer is formed with a third step structure at the inner side of the edge of the electrode layer to form a first gap between the electrode layer and at least a portion of the dielectric layer located between an outer edge of the dielectric layer and the third step structure, and the first gap is at least a portion of the cantilever gap.

In some examples, the dielectric layer, the edge convex layer and the passivation layer all extend outwardly beyond the edge of the electrode layer to form a second gap between a portion of the dielectric layer beyond the edge of the electrode layer and the piezoelectric layer, the second gap is connected with the first gap and the second gap is a portion of the cantilever gap.

In some examples, the bulk acoustic wave resonator further includes a base substrate, wherein the piezoelectric layer and the electrode layer located at both sides of the piezoelectric layer constitute at least a portion of a piezoelectric resonance layer, the piezoelectric resonance layer is arranged on the base substrate, and an acoustic wave reflection structure is arranged between the piezoelectric resonance layer and the base substrate.

In some examples, an area where the piezoelectric layer overlaps with the electrode layer located at both sides of the piezoelectric layer is an effective resonance area, and an orthographic projection of the effective resonance area on the base substrate falls within an orthographic projection of the acoustic wave reflection structure on the base substrate.

In some examples, an orthographic projection of the cantilever gap on the base substrate is located within the orthographic projection of the acoustic wave reflection structure on the base substrate.

In some examples, the acoustic wave reflection structure includes a cavity, and the bulk acoustic wave resonator further includes a support layer formed on the base substrate, the base substrate and the support layer enclose and delimit the cavity, the piezoelectric resonance layer is formed at one side of the cavity away from the base substrate, the electrode layer facing the cavity is a first electrode layer and the electrode layer facing away from the cavity is a second electrode layer, and the electrode edge frame structure is formed on at least one of the first electrode layer and the second electrode layer.

In some examples, the electrode edge frame structure is formed on at least at a portion of an entire edge of the electrode layer.

In some examples, a planar shape of the electrode layer provided with the electrode edge frame structure is a polygon shape, the polygon shape includes M edges, the electrode edge frame structure is arranged at each of M-N edges, and each of N edges of the electrode layer where the electrode edge frame structure is not arranged is provided with an electrode lead-out side convex lamination, and a type and an amount of laminated layers comprised in the electrode lead-out side convex lamination are as same as those comprised in the convex structure, where M and N both are positive integers, and N is smaller than M.

In some examples, the edge convex layer in the electrode lead-out side convex lamination and the edge convex layer in the convex structure are connected to each other to form an annular structure.

In some examples, each of the N edges of the electrode layer where the electrode edge frame structure is not arranged is further provided with an electrode lead-out layer, and the electrode lead-out layer is electrically connected with the electrode layer.

In some examples, the electrode lead-out layer is also electrically connected with the edge convex layer in the electrode lead-out side convex lamination.

In some examples, a planar shape of the electrode layer provided with the electrode edge frame structure is a polygon shape, the polygon shape includes M edges, and the electrode edge frame structure is formed at each of M-N edges; the bulk acoustic wave resonator further includes an electrode lead-out layer located at each of N edges of the electrode layer where the electrode edge frame structure is not arranged, and the dielectric layer includes a via hole, the electrode lead-out layer is electrically connected with the electrode layer through the via hole in the dielectric layer, where M and N both are positive integers, and N is smaller than M.

In some examples, the edge convex layer is a metal layer.

At least one embodiment according to the present disclosure provides a bulk acoustic wave filter including at least one bulk acoustic wave resonator, and the at least one bulk acoustic wave resonator is any of the bulk acoustic wave resonators described above.

BRIEF DESCRIPTION OF THE DRAWINGS

In order to clearly illustrate the technical solutions of the embodiments of the present disclosure, the drawings of the embodiments will be briefly described in the following; it is obvious that the described drawings below are only related to some embodiments of the present disclosure without construing any limitation thereto.

DETAILED DESCRIPTION

Figure 1:
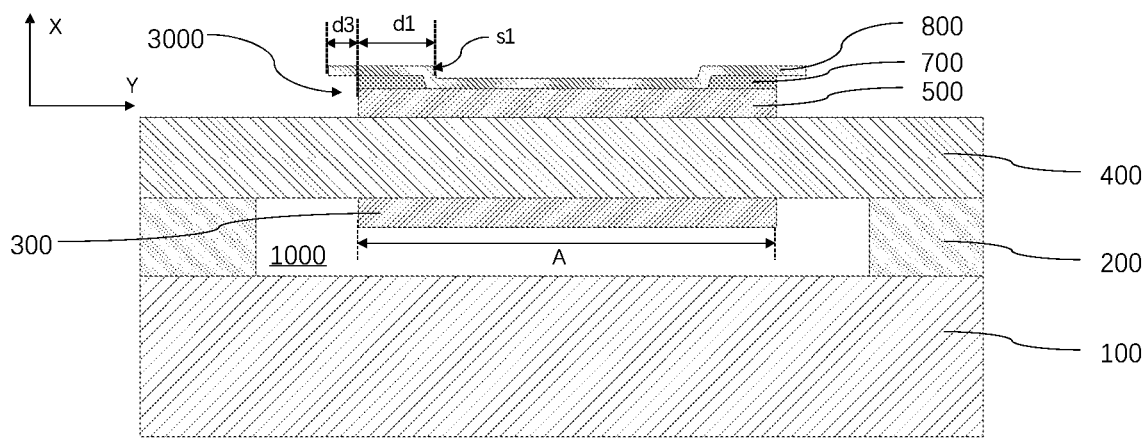
FIGS. 1 to 33 are cross-sectional views of bulk acoustic wave resonators according to some embodiments of the present disclosure, respectively.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

In order to improve an insertion loss performance of a bulk acoustic wave resonator, a structure of the bulk acoustic wave resonator is continuously optimized to improve a quality factor (Q value) and a parallel resonance impedance (Rp value) of the resonator. For example, in designs of some bulk acoustic wave resonators, a lower electrode, a piezoelectric layer and an upper electrode are stacked sequentially to form a piezoelectric resonance layer, and a tilted cantilever structure is arranged at an edge of the upper electrode to form an air gap between the upper electrode and the piezoelectric layer. Such structure with the tilted electrode edge and the air gap can effectively restrain transverse mode acoustic waves from propagating outwardly, increase the parallel resonance impedance (Rp value), and meanwhile reducing the energy dissipation and increasing the Q value of the bulk acoustic wave resonator. However, it is difficult to control a transverse length of the air gap in the manufacturing process of such structure, which results in being difficult to control the improvement of Rp value and Q value.

At least one embodiment of the present disclosure provides a bulk acoustic wave resonator, which includes: a piezoelectric layer; an electrode layer located at both sides of the piezoelectric layer; and an electrode edge frame structure located at an edge of the electrode layer and located at one side of the electrode layer away from the piezoelectric layer, wherein a direction perpendicular to the piezoelectric layer is a first direction, and a direction that is parallel to the piezoelectric layer and is perpendicular to the edge of the electrode layer where the electrode edge frame structure is arranged is a second direction; the electrode edge frame structure includes a laminated structure, the laminated structure includes an edge convex layer and a passivation layer which are stacked in the first direction, and the passivation layer is located at one side of the edge convex layer away from the piezoelectric layer; in the second direction, the laminated structure includes a cantilever member and a convex structure which are connected with each other, and the cantilever member is located at one side of the convex structure away from a central portion of the electrode layer; a cantilever gap is arranged between the cantilever member and at least one of the piezoelectric layer and the electrode layer; in the second direction, an inner edge of the edge convex layer is located at an inner side of the edge of the electrode layer, and the passivation layer covers the edge convex layer to form a first step structure at the inner edge of the edge convex layer; and the convex structure is located between an inner edge of the cantilever gap and the first step structure of the passivation layer. In the bulk acoustic wave resonator according to the embodiment of the present disclosure, the electrode edge frame structure is separately formed on an edge portion of the electrode layer, and the cantilever member and the convex structure in the electrode edge frame structure can generate an area or interface where an acoustic wave propagation impedance is changed, and the convex structure is a laminated structure, so that the transverse waves can be better reflected back into the resonator and the energy loss can be reduced. Moreover, in the embodiment according to the present disclosure, a size of the convex structure with a laminated structure is mainly determined by a size of at least a portion of the edge convex layer, and the edge convex layer on the electrode layer can be formed by a patterning method, so that the size of the convex structure can be controlled more accurately, the capability of reflecting transverse waves back into the resonator can be further controlled, and the energy loss can be reduced.

In order to further clearly explain the structures, the corresponding functions and advantages of the bulk acoustic wave resonator according to some embodiments of the present disclosure, the technical solutions of the bulk acoustic wave resonator according to some embodiments of the present disclosure will be described in more details below with reference to the accompanying drawings.

In the embodiments described below, a film bulk acoustic wave resonator (FBAR) is described by way of example. However, the embodiments according to the present disclosure are not limited to the film bulk acoustic wave resonator, but may also be other types of bulk acoustic wave resonators such as bulk acoustic wave-solidly mounted resonator (BAW-SMR).

FIG. 1 is a schematic diagram of a cross-sectional structure of a film bulk acoustic wave resonator according to some embodiments of the present disclosure. As shown in FIG. 1, the film bulk acoustic wave resonator includes a base substrate 100 and a piezoelectric resonance layer formed on the base substrate 100. The piezoelectric resonance layer includes a lower electrode layer 300, a piezoelectric layer 400, and an upper electrode layer 500 stacked sequentially in a direction (X direction) perpendicular to the base substrate 100. For example, a support layer 200 is arranged between the piezoelectric resonance layer and the base substrate 100, and the support layer 200 is arranged close to an edge of the piezoelectric resonance layer, thereby defining a cavity 1000 between the piezoelectric resonance layer, the support layer 200 and the base substrate 100. The cavity 1000 can be used for an acoustic wave reflection between the piezoelectric resonance layer and the base substrate 100, and can also be referred to as an acoustic wave reflection structure. For example, an effective area of the piezoelectric resonance layer is an area where the lower electrode layer 300, the piezoelectric layer 400 and the upper electrode layer 500 are overlapped each other and are further overlapped with the cavity in the direction perpendicular to the piezoelectric layer 400 (that is, the direction perpendicular to the base substrate 100, i.e., the X direction). For example, as shown in FIG. 1, an area A indicated by a double arrow is an effective resonance area of the piezoelectric resonance layer. It should be explained that, for the sake of simplicity of illustration, the label of the effective resonance area A is omitted in the subsequent cross-sectional views.

As shown in FIG. 1, in the film bulk acoustic wave resonator according to some embodiments of the present disclosure, an electrode edge frame structure is arranged at an edge of the upper electrode layer 500 and at one side of the upper electrode layer 500 away from the piezoelectric layer 400. The electrode edge frame structure is a laminated structure arranged along at least a portion of the edge of the upper electrode layer 500, for example, the portions indicated by d1 and d3 in the laminated structure on the upper electrode layer 500 as shown in FIG. 1.

For convenience of description, the direction perpendicular to the piezoelectric layer 400 is set as the first direction X, and the direction that is perpendicular to the edge of the upper electrode layer 500 (that is, the left or right edge of the upper electrode layer 500 in FIG. 1) provided with the electrode edge frame structure and is parallel to the piezoelectric layer 400 is set as the second direction Y. The electrode edge frame structure includes an edge convex layer 700 and a passivation layer 800 stacked in the first direction X. The passivation layer 800 is located at the side of the edge convex layer 700 away from the piezoelectric layer 400. In the second direction Y, the laminated structure of the electrode edge frame structure can be divided into a cantilever member and a convex structure connected with each other. In this embodiment, the cantilever member is corresponding to the portion indicated by d3, and the convex structure is corresponding to the portion indicated by d1. The cantilever member d3 is located at one side of the convex structure d1 away from a central portion of the upper electrode layer 500. For example, as shown in FIG. 1, in the second direction Y, the cantilever member d3 is farther from the central portion of the upper electrode layer 500 than the convex structure d1. The cantilever member d3 extends to an outer side of the edge of the upper electrode layer 500, thereby forming a gap 3000 between the cantilever member d3 and the piezoelectric layer 400. An inner edge of the edge convex layer 700 (the edge of the edge convex layer 700 close to the central portion of the upper electrode layer 500 in FIG. 1) is located on the upper electrode layer 500, that is, located at an inner side of the edge of the upper electrode layer 500, and the passivation layer 800 covers the edge convex layer 700 to form a first step structure s1 at the inner edge of the edge convex layer 700. In the second direction Y, the convex structure d1 is located between an inner edge of the gap 3000 and the first step structure s1 of the passivation layer 800.

In order to facilitate the description and understanding of the technical solutions of the embodiments of the present disclosure, some of the above-mentioned terms will be explained as below. Unless stated to the contrary, the explanations of these terms are also applicable to other embodiments in the present disclosure. The direction perpendicular to the piezoelectric layer 400 is set as the first direction X, that is, the vertical direction in FIG. 1. It should be explained that, the direction perpendicular to the piezoelectric layer 400 refers to a direction perpendicular to a plane where most portions of the piezoelectric layer 400 are located, and it is not required that all the portions of the piezoelectric layer 400 are flat and located on the same plane. For example, the direction perpendicular to the piezoelectric layer 400 is approximately the same as the direction perpendicular to the base substrate 100. For example, "perpendicular to" used herein is not limited to "strictly perpendicular to", but also can be the case of deviating from the strictly perpendicular direction by a small angle, for example, an angle smaller than 10 degrees or 5 degrees. The direction that is perpendicular to the edge of the electrode layer (for example, the upper electrode layer 500 in FIG. 1, but not limited thereto) provided with the electrode edge frame structure and is parallel to the piezoelectric layer 400 is set as the second direction Y. Similarly, the direction parallel to the piezoelectric layer 400 here may be a direction parallel to a plane where most portions of the piezoelectric layer 400 are located, and may be the case of an approximately parallel direction. Moreover, the electrode edge frame structure is arranged along the edge of the electrode layer (for example, the upper electrode layer 500 in FIG. 1), then the edge of the upper electrode layer 500 provided with the electrode edge frame structure extends in a direction perpendicular to the paper of FIG. 1 because FIG. 1 is a cross-sectional view, thus the second direction here is the Y direction shown in FIG. 1. In the embodiment shown in FIG. 1, the electrode edge frame structure includes an edge convex layer 700 and a passivation layer 800. However, the passivation layer 800 can also extend to other areas on the upper electrode layer 500 if there are no other restrictions. For example, as shown in FIG. 1, the passivation layer 800 is also distributed in an area between two edge convex layers 700 arranged opposite to each other. Moreover, the "inner" in the "inner edge" described above means that, in the direction parallel to the piezoelectric layer, the side close to the central portions of the piezoelectric layer 400 and the electrode layers 300, 500 is referred to as an "inner" side. Similarly, the side away from the central portions of the piezoelectric layer 400 and the electrode layers 300, 500 can be referred to as an "outer" side. For the same feature, element or layer, the outer side and the inner side are relative positions, the meanings thereof can be clearly appreciated based on the description of the context, and the positional relationships of the outer side and the inner side here can also be more apparent in a plan view described later. For example, the above-mentioned "gap" can be an air gap, but it can also be filled with other materials resulting in low speed of sound. Because the sound has the lowest speed in air, the effect brought by the air gap is better.

As shown in FIG. 1, in a working process of the film bulk acoustic wave resonator, transverse waves will be generated. If the transverse waves are transmitted to the outside of the effective resonance area A of the piezoelectric resonance layer, it indicates the existence of an energy loss, that is, the quality factor (Q value) of the resonator will be reduced, hence the performance of the filter composed of multiple resonators will be deteriorated. In the film bulk acoustic wave resonator according to the embodiments of the present disclosure, the edge of the upper electrode layer 500 is provided with the electrode edge frame structure, so that an area or interface where the acoustic wave propagation impedance is changed can be generated at the position where the electrode edge frame structure is arranged, and the transverse waves can be reflected back into the resonator, thereby reducing the energy loss. In this embodiment, the electrode edge frame structure includes a convex structure and a cantilever member which are connected with each other and are located on the upper electrode layer 500, and at least the convex structure is a laminated structure. As shown in FIG. 1, a width of the convex structure d1 is a size in the second direction Y. For example, the width of the convex structure d1 has an influence on the effect of reflecting acoustic waves, and can be an integer multiple of the half wavelength of the transverse waves propagating in the resonator. In some examples, the width of the convex structure d1 may be 2 to 4 times of the half wavelength of the transverse waves, for example, it may be 3 times of the half wavelength. In the case of the above-mentioned multiple, the problem that the technical process is difficult to control because the multiple is too small (the size is too small) can be prevented, and the problem that an effective electromechanical coupling coefficient (Keff2 value) of the resonator is influenced by an excessively greater multiple can also be avoided. However, the above-mentioned multiple in the film bulk acoustic wave resonator according to the embodiments of the present disclosure is not limited to the illustrative ones above. For the cantilever member d3 in the electrode edge frame structure, a gap 3000 is formed between the cantilever member d3 and the piezoelectric layer, and a second area or interface where the acoustic wave propagation impedance is changed can be formed at the gap 3000. When the cantilever member d3 cooperates with the convex structure d1 having a laminated structure, the leaked, transverse waves can be better reflected back into a main body of the resonator. A width of the cantilever member d3, that is, a size in the second direction Y, also has an influence on the effect of reflecting transverse waves, which however is not as great as the influence resulted by the convex structure d1. A combination of the convex structure and the cantilever member described above achieves double filtering effects, and can reflect the acoustic waves in two stages, which is beneficial to the improvement of the quality factor.

An accurate control of the width of the convex structure d1 can improve the performance of the film bulk acoustic wave resonator. In the film bulk acoustic wave resonator according to the embodiment of the present disclosure, the width of the convex structure d1 is mainly influenced by a size of the edge convex layer 700, because the size of the edge convex layer 700 also affects the position of the first step structure formed by the passivation layer in the convex structure. In the embodiment of the present disclosure, the edge convex layer in the convex structure is a layer separately formed on the upper electrode layer 500, so the size of the edge convex layer can be well controlled by a patterning process. Thus, the width of the convex structure d1 can also be well controlled, so that the performance of the film bulk acoustic wave resonator can be improved.

For example, in the embodiment shown in FIG. 1, an outer edge of the edge convex layer 700 is aligned with the edge of the upper electrode layer 500, and the passivation layer 800 extends outwardly beyond the edge of the upper electrode layer 500, thus forming a gap 3000 between the passivation layer 800 and the piezoelectric layer 400. It should be pointed out that, "aligned with" used herein refers to an alignment in the direction perpendicular to the piezoelectric layer 400 (the first direction X), and the alignment here is not limited to a strict alignment but there may be some deviations within the range of process errors. Moreover, unless otherwise specified, the explanation of "aligned with" here is also applicable to the embodiments to be described below.

Figure 2:
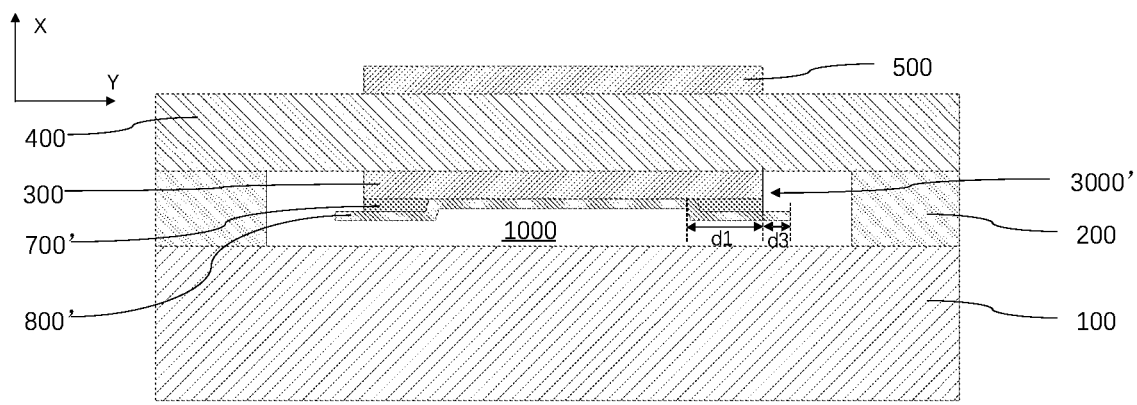

FIG. 2 is a schematic diagram of a cross-sectional structure of a film bulk acoustic wave resonator according to some other embodiments of the present disclosure. What is different from FIG. 1 is that, the electrode edge frame structure is formed on the lower electrode layer 300, that is, formed at an edge of the lower electrode layer 300 and at one side away from the piezoelectric layer 400. In this embodiment, the same reference signs represent the same features as in the embodiment of FIG. 1. Moreover, the reference signs of the edge convex layer 700', the passivation layer 800' and the gap 3000' are indicated by the same numbers as those of the corresponding features in FIG. 1, and are distinguished by a symbol 1', so as to more clearly indicate the correspondences therebetween. Based on the above description of FIG. 1, the structure of the embodiment shown in FIG. 2 is also clear. For example, the upper electrode layer 500 in the description of the embodiment of FIG. 1 can be replaced by the lower electrode layer 300. For example, the electrode edge frame structure provided on the lower electrode layer 300 is located in the cavity 1000. The embodiment shown in FIG. 2 can also achieve the same technical effects as the embodiment shown in FIG. 1, and the detailed structures and technical effects thereof will not be repeatedly described here.

Figure 3:
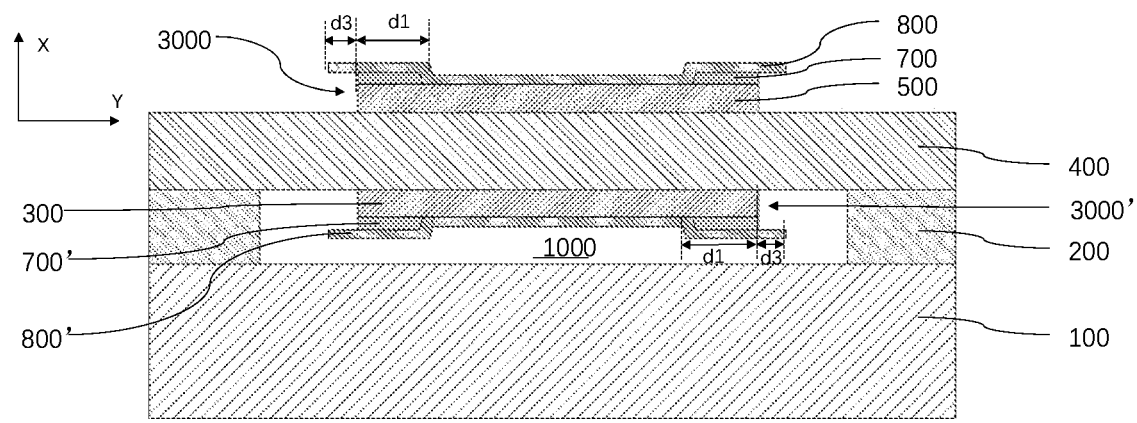

FIG. 3 is a schematic diagram of a cross-sectional structure of a film bulk acoustic wave resonator according to some other embodiments of the present disclosure. What is different from FIG. 1 is that, the electrode edge frame structure is formed on both the upper electrode layer 500 and the lower electrode layer 300, that is, formed at the edge of the upper electrode layer 500 and at the side away from the piezoelectric layer 400, and formed at the edge of the lower electrode layer 300 and at the side away from the piezoelectric layer 400. The same features in FIG. 3 are indicated by the same reference signs as those in FIG. 1 and FIG. 2, respectively, and the same parts as those in FIG. 1 and FIG. 2 can be referred to the description of the embodiments above, without repeated description here.

Figure 4:
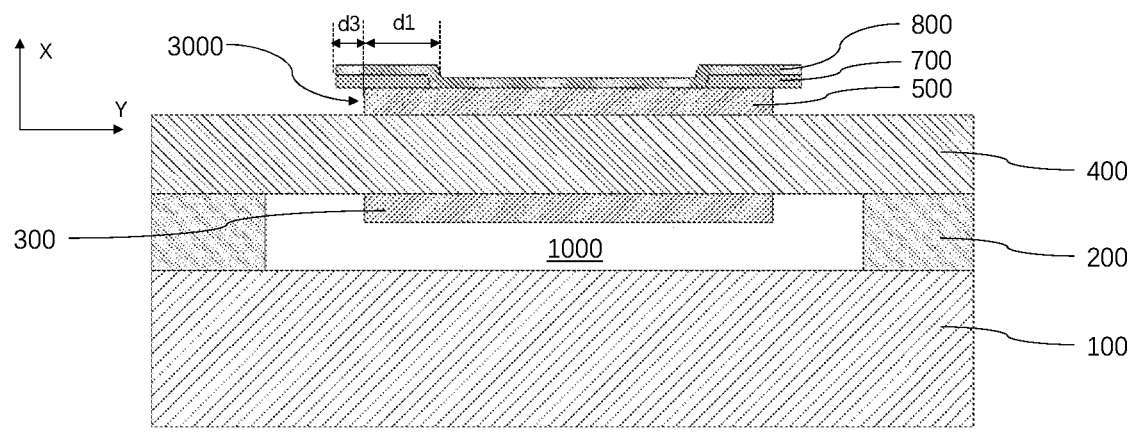

FIG. 4 is a schematic diagram of a cross-sectional structure of a film bulk acoustic wave resonator according to some other embodiments of the present disclosure. What is different from FIG. 1 is that, both the edge convex layer 700 and the passivation layer 800 extend beyond the edge of the upper electrode layer 500, thus forming a gap 3000 between the edge convex layer 700 and the piezoelectric layer 400. For other parts, reference can be made to the description of the embodiments above, which will not be repeatedly described here.

Figure 5:
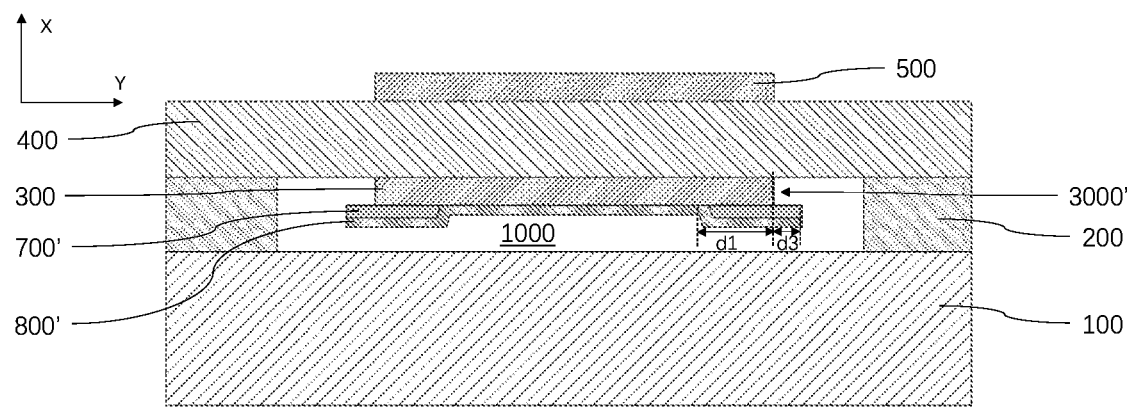
Figure 6:
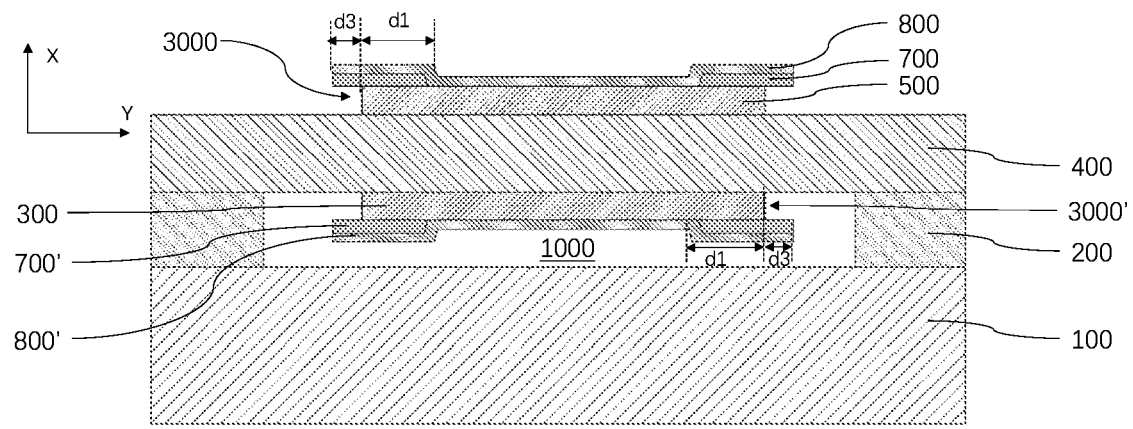

FIGS. 5 and 6 are schematic diagrams of a cross-sectional structure of a film bulk acoustic wave resonator according to some other embodiments of the present disclosure. What is different from FIG. 4 is that, the electrode edge frame structure in FIG. 5 is formed on the lower electrode layer 300, and the electrode edge frame structure in FIG. 6 is formed on both the lower electrode layer 300 and the upper electrode layer 500. Similarly, on the basis of the reference signs of the layers and gaps related to the electrode edge frame structure on the upper electrode layer 500, the reference signs of the layers and gaps related to the electrode edge frame structure on the lower electrode layer 300 are added with "'" to show the distinction. For other parts, reference can be made to the description of the embodiments above, which will not be repeatedly described here.

Figure 7:
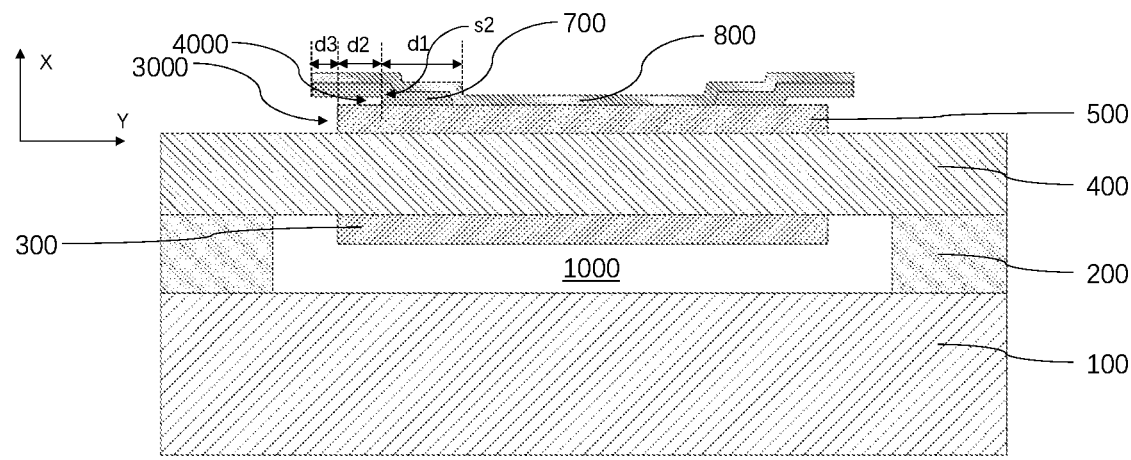

FIG. 7 is a schematic diagram of a cross-sectional structure of a film bulk acoustic wave resonator according to some other embodiments of the present disclosure. On the basis of the embodiment shown in FIG. 4, the edge convex layer 700 in this embodiment has a second step structure s2 formed between the outer edge and the inner edge (that is, in the central portion) of the edge convex layer 700, so that a portion between the outer edge of the edge convex layer 700 and the second step structure s2 is raised relative to other portions, thereby forming a gap 4000 between the raised portion of the edge convex layer 700 and the upper electrode layer 500. Furthermore, in this embodiment, the outer edges of the edge convex layer 700 and the passivation layer 800 also extend outwardly beyond the edge of the upper electrode layer 500, thus forming a gap 3000 between a portion of the edge convex layer 700 beyond the edge of the upper electrode 500 and the piezoelectric layer. As shown in FIG. 7, the gap 3000 and the gap 4000 are connected to each other, thus jointly constituting a gap between the cantilever member of the electrode edge frame structure and each of the upper electrode layer 500 and the piezoelectric layer 400. For example, a portion of the cantilever member corresponding to the gap 4000 is indicated by d2, and a portion of the cantilever member corresponding to the gap 3000 is indicated by d3. That is to say, in this embodiment, the cantilever member in the electrode edge frame structure includes two portions indicated by d2 and d3, respectively, which jointly serve as the above-mentioned second area or interface where the acoustic wave propagation impedance is changed, thereby reflecting the leaked, transverse waves again. Furthermore, in this embodiment, a width (i.e., a size in the second direction Y) of the portion d2 of the cantilever member can be controlled to be relatively small, because there is no edge reflection structure for the transverse waves at the portion corresponding to d2 on the surface of the upper electrode layer 500. If the width of the portion d2 is controlled to be relatively small, the area where the transverse waves are not reflected will also be relatively small, and the performance of the resonator can be improved. However, the specific value of the width of the portion d2 is not limited in the embodiments of the present disclosure, and can be set depending on situations. For example, the width of the portion d2 can be controlled to be 0.3-0.5 microns. For the functions and parameters of the convex structure d1 in this embodiment, reference can be made to the description of the embodiments above, and the width of the entire cantilever member d2 and d3 can also refer to the contents of the embodiments above, which will not be repeatedly described here.

Figure 8:
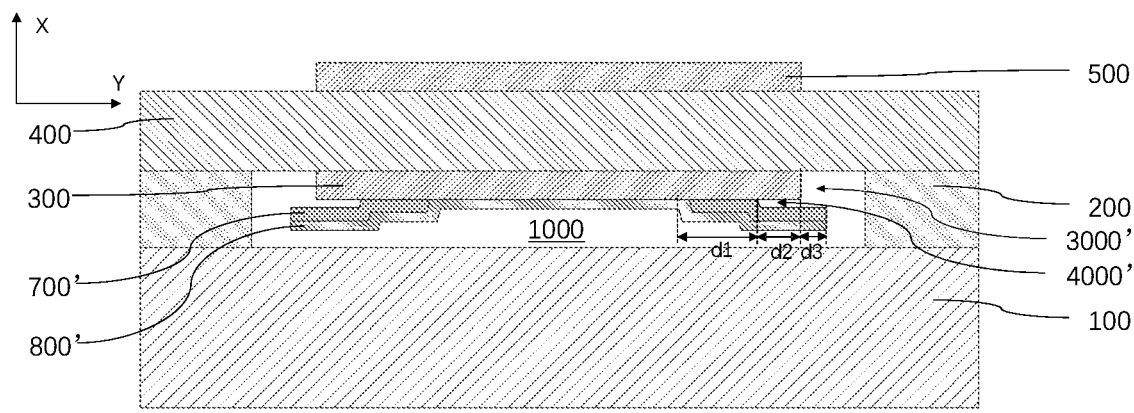
Figure 9:
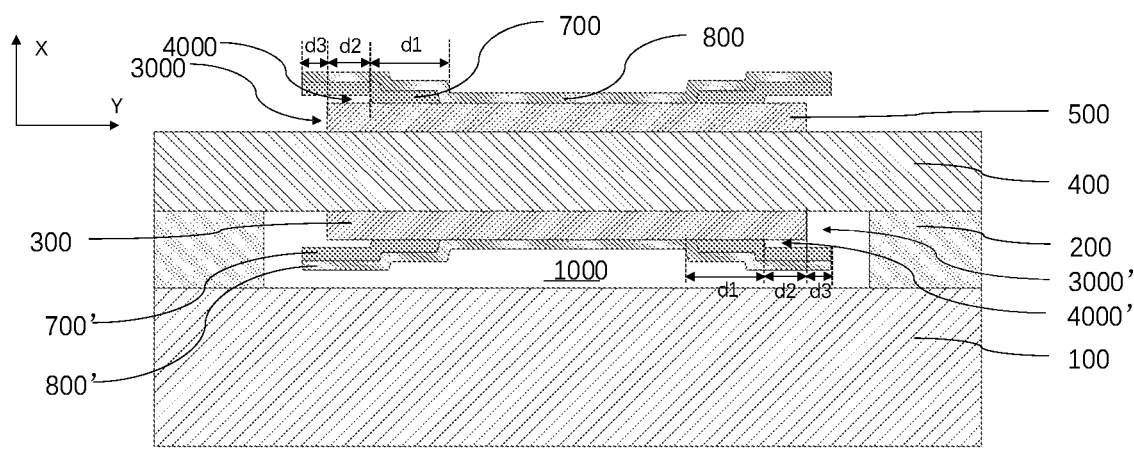

FIGS. 8 and 9 are schematic diagrams of a cross-sectional structure of a film bulk acoustic wave resonator according to some other embodiments of the present disclosure. What is different from FIG. 7 is that, the electrode edge frame structure in FIG. 8 is formed on the lower electrode layer 300, and the electrode edge frame structure in FIG. 9 is formed on both the lower electrode layer 300 and the upper electrode layer 500. Similarly, on the basis of the reference signs of the layers and gaps related to the electrode edge frame structure on the upper electrode layer 500, the reference signs of the layers and gaps related to the electrode edge frame structure on the lower electrode layer 300 are added with "'" to show the distinction. For other parts, reference can be made to the description of the embodiments above, which will not be repeatedly described here.

Figure 10:
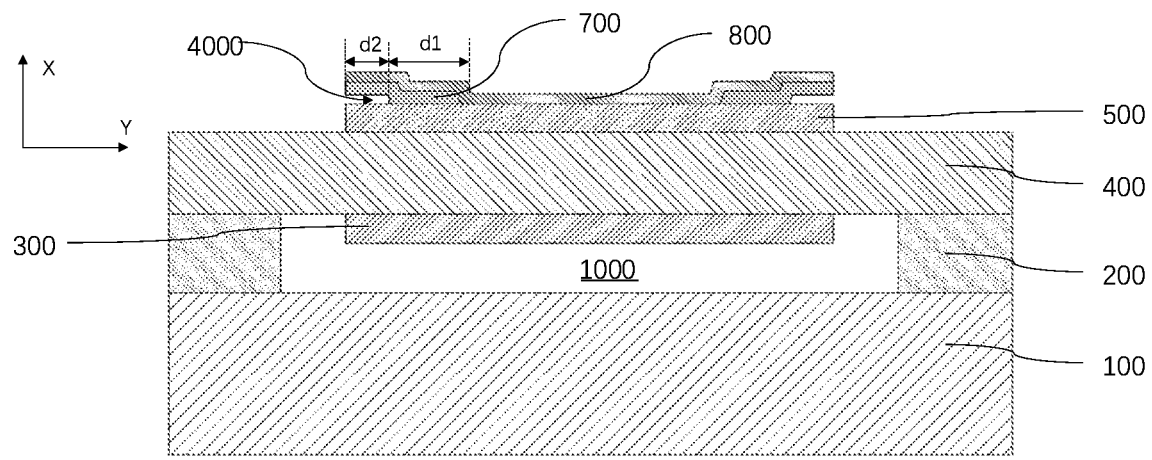

FIG. 10 is a schematic diagram of a cross-sectional structure of a film bulk acoustic wave resonator according to some embodiments of the present disclosure. What is different from FIG. 7 is that, the outer edges of the edge convex layer 700 and passivation layer 800 are aligned with the edge of the upper electrode layer 500. Therefore, in the embodiment shown in FIG. 10, there is no gap between the cantilever member and the piezoelectric layer 400.

Figure 11:
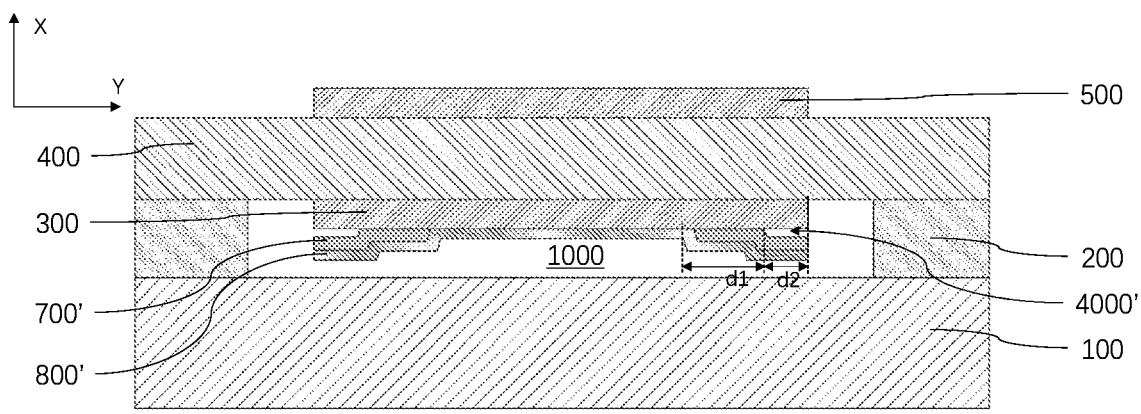
Figure 12:
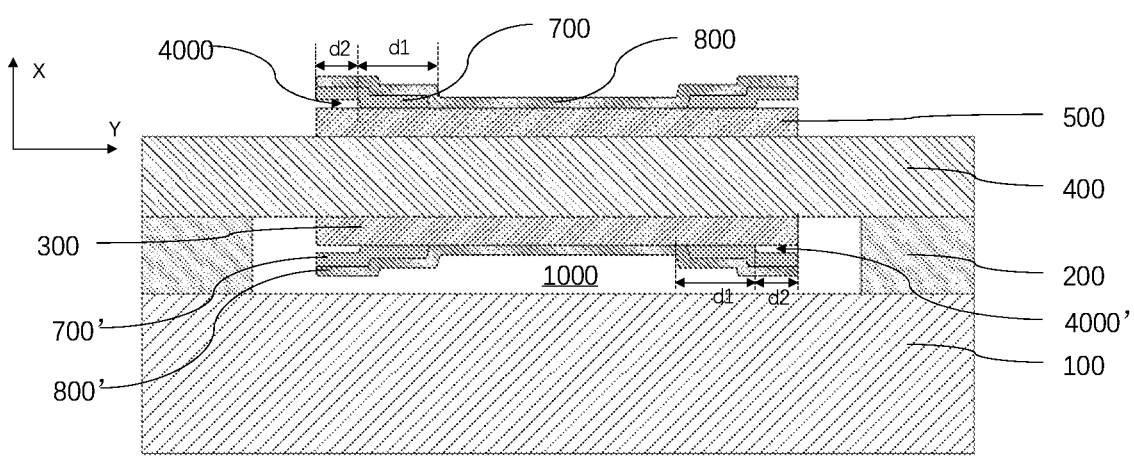

FIGS. 11 and 12 are schematic diagrams of a cross-sectional structure of a film bulk acoustic wave resonator according to some other embodiments of the present disclosure. What is different from FIG. 10 is that, the electrode edge frame structure in FIG. 11 is formed on the lower electrode layer 300, and the electrode edge frame structure in FIG. 12 is formed on both the lower electrode layer 300 and the upper electrode layer 500. Similarly, on the basis of the reference signs of the layers and gaps related to the electrode edge frame structure on the upper electrode layer 500, the reference signs of the layers and gaps related to the electrode edge frame structure on the lower electrode layer 300 are added with "'" to show the distinction. For other parts, reference can be made to the description of the embodiments above, which will not be repeatedly described here.

Figure 13:
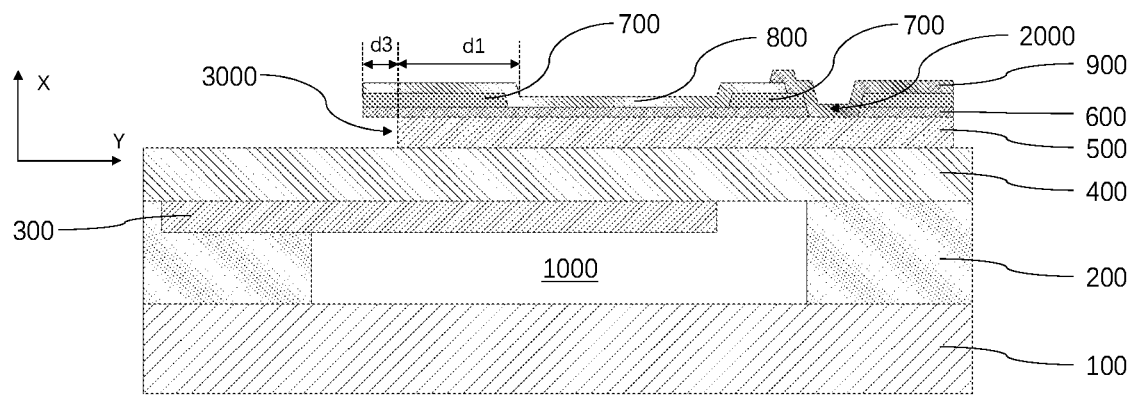

FIG. 13 is a schematic diagram of a cross-sectional structure of a film bulk acoustic wave resonator according to some embodiments of the present disclosure. As shown in FIG. 13, in the film bulk acoustic wave resonator according to these embodiments, in the first direction X, a dielectric layer 600 is further provided between the edge convex layer 700 and the upper electrode layer 500. In the embodiment shown in FIG. 13, the passivation layer 800, the edge convex layer 700 and the dielectric layer 600 all extend outwardly beyond the edge of the upper electrode layer 500, thus forming a gap 3000 between the dielectric layer 600 and the piezoelectric layer 400. In this embodiment, the cantilever member d3 and the convex structure d1 each include a three-layered structure constituted by the dielectric layer 600, the edge convex layer 700 and the passivation layer 800. Moreover, in FIG. 13, at a side of the upper electrode layer 500 opposite to the side where the electrode edge frame structure is formed, an upper electrode lead-out metal layer 900 used for an electrical connection with the upper electrode layer 500 is also provided. For example, the dielectric layer 600 includes a via hole 2000 at this position, and the upper electrode lead-out metal layer 900 is electrically connected with the upper electrode layer 500 through the via hole 2000 in the dielectric layer 600. The planar positional relationship of the upper electrode lead-out metal layer 900 will be described later with reference to a plan view.

According to the description of the embodiments above, the width of the convex structure (the size along the second direction Y) has a great influence on the performance of the film bulk acoustic wave resonator, while the width of the convex structure is determined by the width of the edge convex layer. Therefore, an accurate control of the size of the edge convex layer is beneficial to the performance improvement of the film bulk acoustic wave resonator. In this embodiment, by introducing the dielectric layer 600, on the one hand, a thickness of the electrode edge frame structure can be increased to improve the acoustic wave reflecting performance. For example, a total thickness of the convex structure can be adjusted by controlling the thickness of the dielectric layer 600, so that the quality factor of the resonator can be improved without affecting the bandwidth performance of the resonator. On the other hand, the introduction of the dielectric layer 600 can also assist in defining a boundary of the edge convex layer 700, so that the size of the edge convex layer 700 can be controlled more accurately. For example, the patterning process for the edge convex layer 700 can be realized by a lift-off method or an etching method. Among these two methods, the etching method is more advantageous for the control of the width size of the edge convex layer 700 and for the edge topography (such as the verticality) of the edge convex layer 700. However, if the material for forming the edge convex layer 700 is directly deposited on the upper electrode layer 500 and then patterned by photolithography and etching, the thickness of the upper electrode layer 500 may be affected in the etching process. In order to ensure the performance of the film bulk acoustic wave resonator, the thickness of the electrode layer, generally, needs to be controlled within +/−2 nm, thus putting forward high requirements for the etching process which is expensive and difficult to control accurately. In this embodiment, a dielectric layer 600 is formed between the edge convex layer 700 and the upper electrode layer 500. The dielectric layer 600 can be used as a stop layer for the etching process of the edge convex layer, so that the upper electrode layer 500 will not be affected when etching the edge convex layer 700. Moreover, due to the existence of the dielectric layer 600, the flexibility of the optimization of the patterning process of the edge convex layer 700 is higher, and the control accuracy of the width size of the edge convex layer 700 can be raised, thereby further improving the performance of the film bulk acoustic wave resonator. As described above, besides the technical effects achieved by the embodiment including a two-layered structure, the film bulk acoustic wave resonator of this embodiment can further have the following technical advantages: the introduction of the dielectric layer 600 can not only enhance the performance improvement brought by the electrode edge frame structure itself, but can also further bring about performance improvement due to its relationships with other parts of the resonator such as the upper electrode layer.

Figure 14:
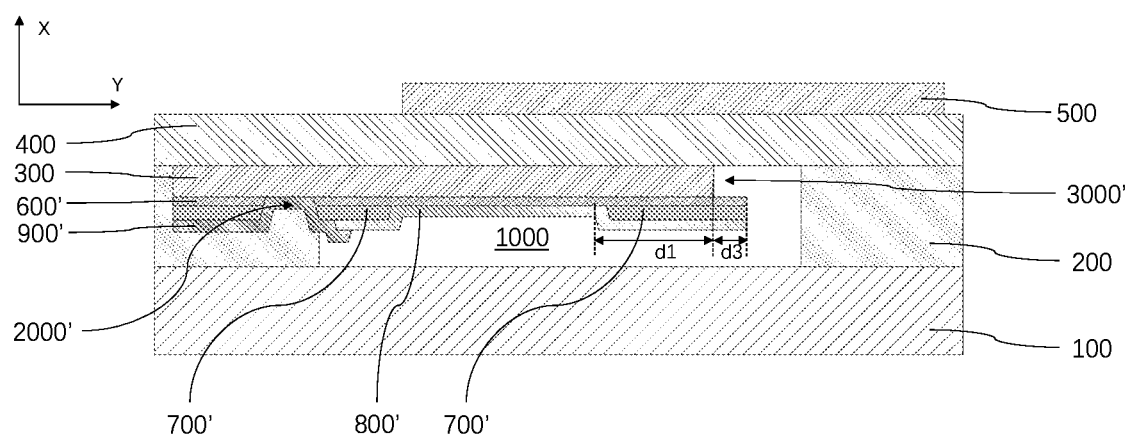
Figure 15:
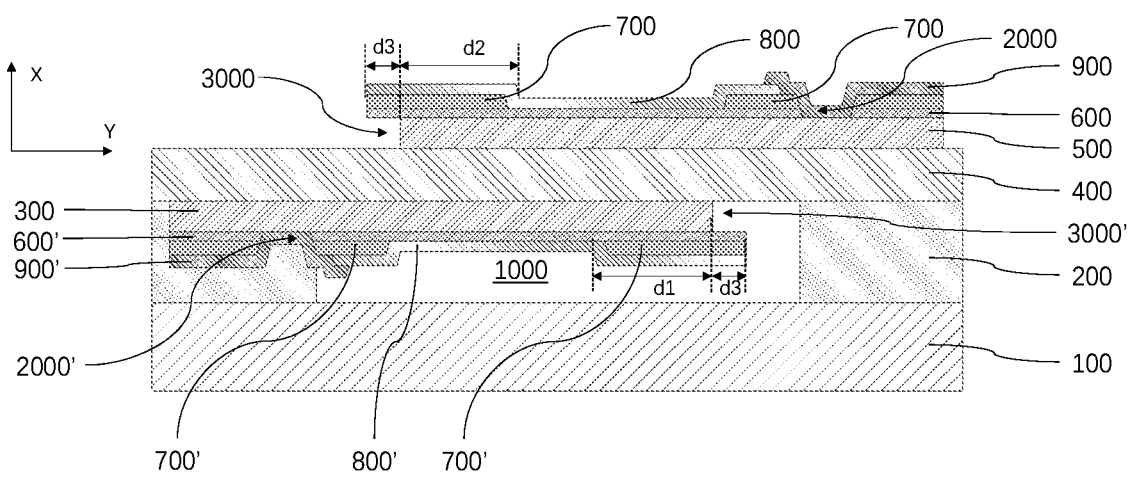

FIGS. 14 and 15 are schematic diagrams of a cross-sectional structure of a film bulk acoustic wave resonator according to some other embodiments of the present disclosure. What is different from FIG. 13 is that, the electrode edge frame structure in FIG. 14 is formed on the lower electrode layer 300, and the electrode edge frame structure in FIG. 15 is formed on both the lower electrode layer 300 and the upper electrode layer 500. Similarly, on the basis of the reference signs of the layers and gaps related to the electrode edge frame structure on the upper electrode layer 500, the reference signs of the layers and gaps related to the electrode edge frame structure on the lower electrode layer 300 are added with "'" to show the distinction. Moreover, the lower electrode layer 300 may also be provided with a lower electrode lead-out metal layer 900'. For other parts, reference can be made to the description of the embodiments above, which will not be repeatedly described here.

Figure 16:
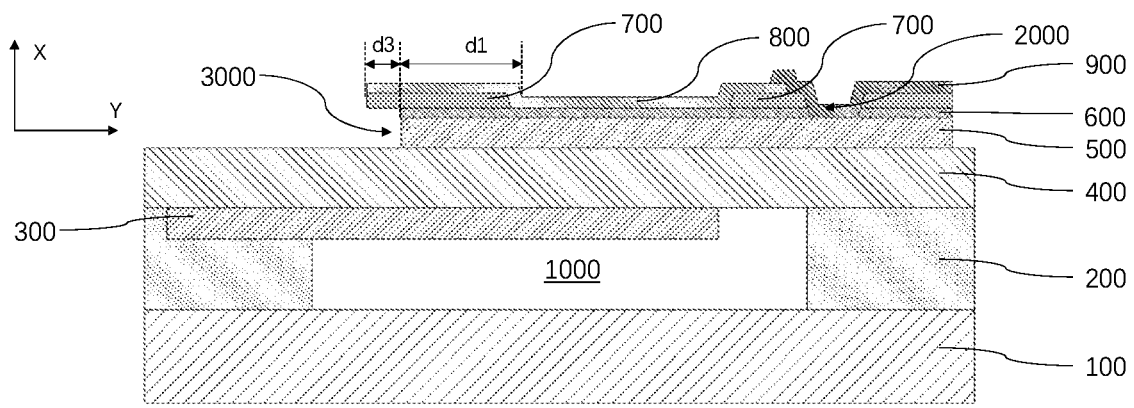

FIG. 16 is a schematic diagram of a cross-sectional structure of a film bulk acoustic wave resonator according to some embodiments of the present disclosure. What is different from FIG. 13 is that, in the embodiment shown in FIG. 16, the outer edge of the dielectric layer 600 is aligned with the edge of the upper electrode layer 500. In this embodiment, the edge convex layer 700 and the passivation layer 800 extend outwardly beyond the edge of the upper electrode layer 500, thus forming a gap 3000 between the edge convex layer 700 and the piezoelectric layer 400. In the embodiment shown in FIG. 16, the cantilever member d3 includes at least a portion of each of the passivation layer 800 and the edge convex layer 700, and the convex structure d1 includes at least a portion of each of the passivation layer 800, the edge convex layer 700 and the dielectric layer 600.

Figure 17:
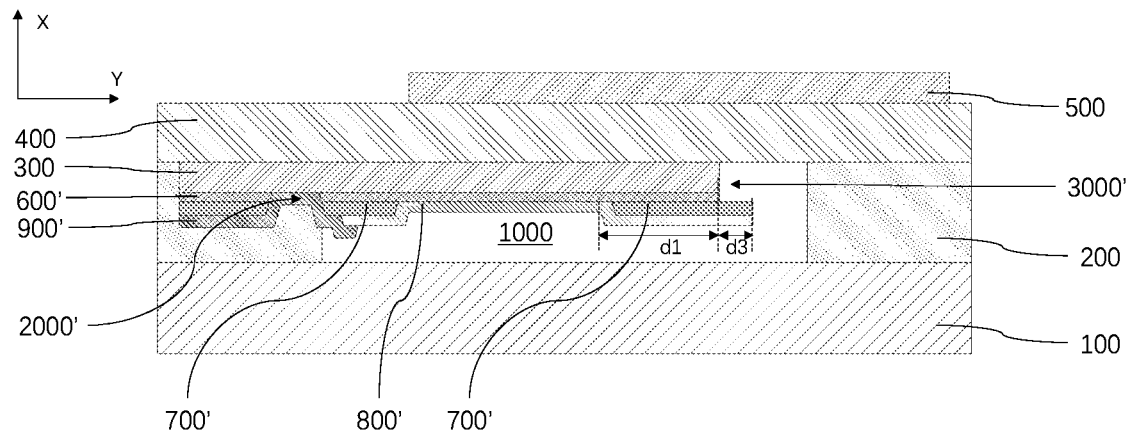
Figure 18:
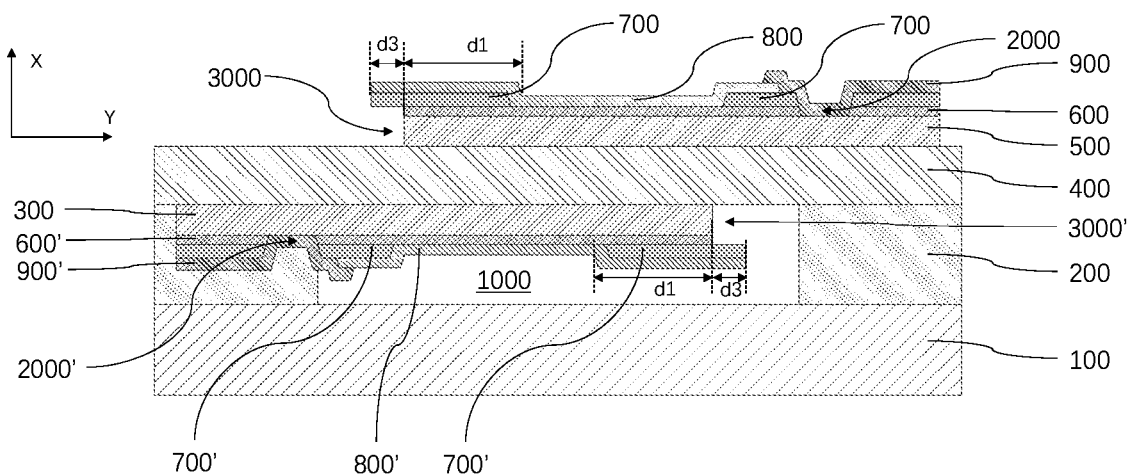

FIGS. 17 and 18 are schematic diagrams of a cross-sectional structure of a film bulk acoustic wave resonator according to some other embodiments of the present disclosure. What is different from FIG. 16 is that, the electrode edge frame structure in FIG. 17 is formed on the lower electrode layer 300, and the electrode edge frame structure in FIG. 18 is formed on both the lower electrode layer 300 and the upper electrode layer 500. Similarly, on the basis of the reference signs of the layers and gaps related to the electrode edge frame structure on the upper electrode layer 500, the reference signs of the layers and gaps related to the electrode edge frame structure on the lower electrode layer 300 are added with "'" to show the distinction. Moreover, the lower electrode layer 300 may also be provided with a lower electrode lead-out metal layer 900'. For other parts, reference can be made to the description of the embodiments above, which will not be repeatedly described here.

Figure 19:
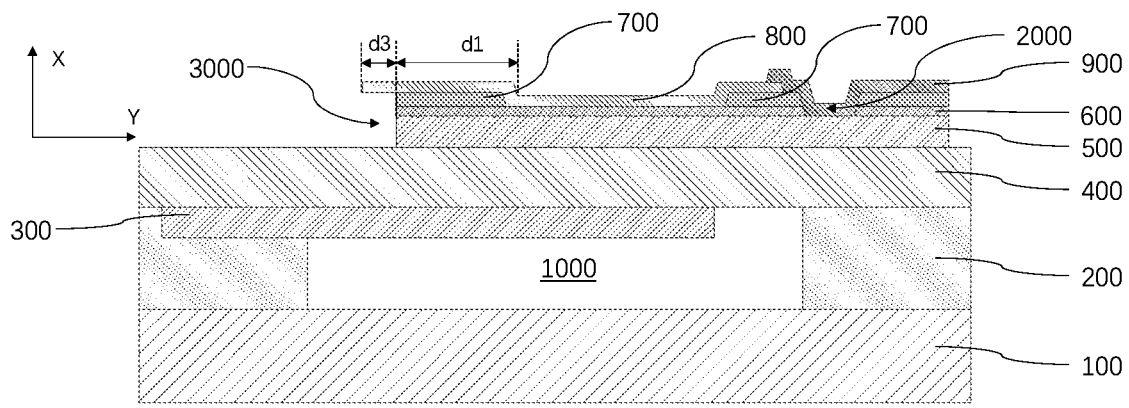

FIG. 19 is a schematic diagram of a cross-sectional structure of a film bulk acoustic wave resonator according to some embodiments of the present disclosure. What is different from FIG. 16 is that, the passivation layer 800 extends outwardly beyond the edge of the upper electrode layer 500, and the outer edges of the edge convex layer 700 and the dielectric layer 600 are aligned with the edge of the upper electrode layer 500, thereby forming a gap 3000 between the passivation layer 800 and the piezoelectric layer 400. In this embodiment, the cantilever member d3 includes at least a portion of the passivation layer 800, while the convex structure d1 includes at least a portion of each of the passivation layer 800, the edge convex layer 700 and the dielectric layer 600.

Figure 20:
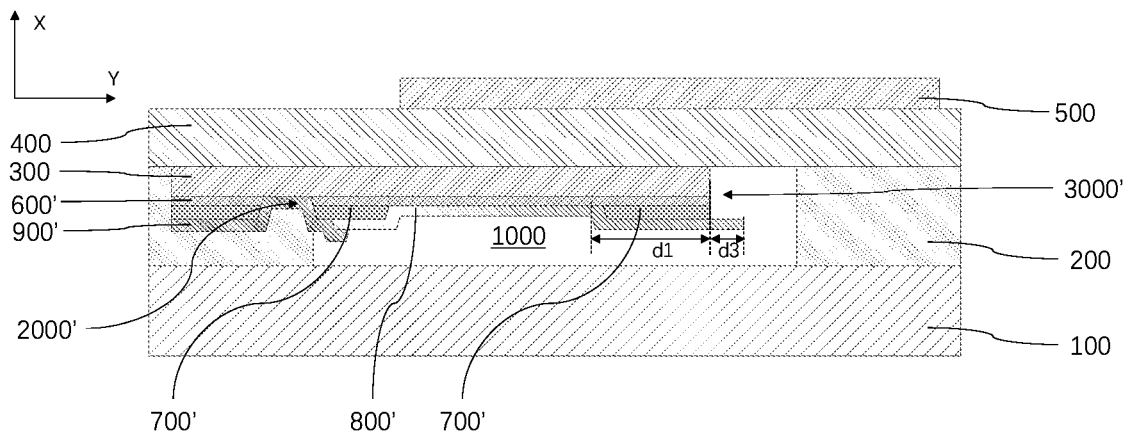
Figure 21:
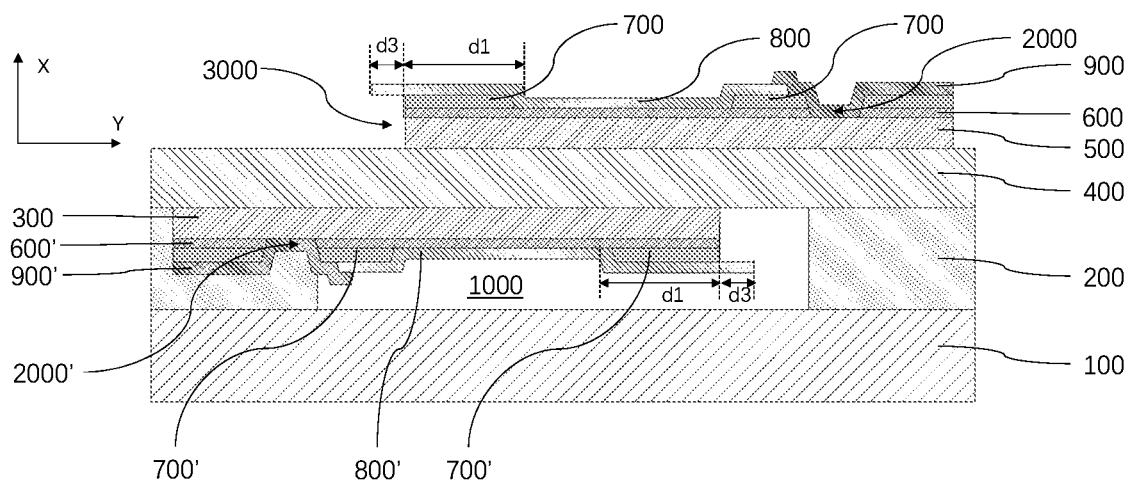

FIGS. 20 and 21 are schematic diagrams of a cross-sectional structure of a film bulk acoustic wave resonator according to some other embodiments of the present disclosure. What is different from FIG. 19 is that, the electrode edge frame structure in FIG. 20 is formed on the lower electrode layer 300, and the electrode edge frame structure in FIG. 21 is formed on both the lower electrode layer 300 and the upper electrode layer 500. Similarly, on the basis of the reference signs of the layers and gaps related to the electrode edge frame structure on the upper electrode layer 500, the reference signs of the layers and gaps related to the electrode edge frame structure on the lower electrode layer 300 are added with "'" to show the distinction. Moreover, the lower electrode layer 300 may also be provided with a lower electrode lead-out metal layer 900'. For other parts, reference can be made to the description of the embodiments above, which will not be repeatedly described here.

Figure 22:
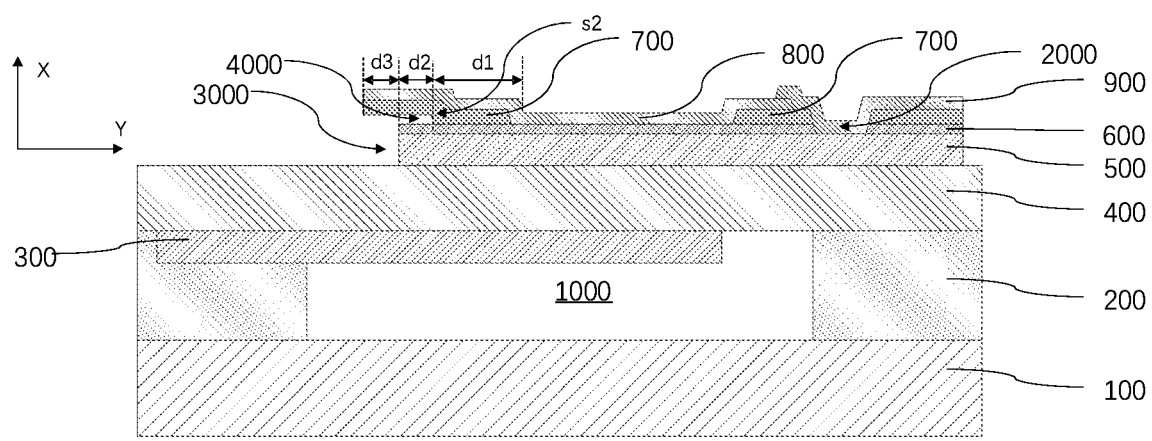

FIG. 22 is a schematic diagram of a cross-sectional structure of a film bulk acoustic wave resonator according to some embodiments of the present disclosure. What is different from the embodiment shown in FIG. 16 is that, the second step structure s2 in FIG. 22 is formed between the outer edge and inner edge of the edge convex layer 700. That is, the edge convex layer 700 is formed with a raised portion between the outer edge of the edge convex layer 700 and the second step structure s2, so that a gap 4000 is formed between at least a part of the raised portion of the edge convex layer 700 and the upper electrode layer 500 beneath the edge convex layer 700, more specifically, the dielectric layer 600 beneath the edge convex layer 700. Moreover, the passivation layer 800 and the edge convex layer 700 of this embodiment also extend outwardly beyond the edge of the upper electrode layer 500, so that a gap 3000 is formed between the edge convex layer 700 and the piezoelectric layer 400. The gap 3000 and the gap 4000 are connected to each other, thus forming a gap between the cantilever member d2, d3 and each of the upper electrode layer 500 (or the dielectric layer 600) and the piezoelectric layer 400. In this embodiment, the cantilever member d2, d3 includes at least a portion of each of the passivation layer 800 and the edge convex layer 700, and the convex structure d1 includes at least a portion of each of the passivation layer 800, the edge convex layer 700 and the dielectric layer 600.

Figure 23:
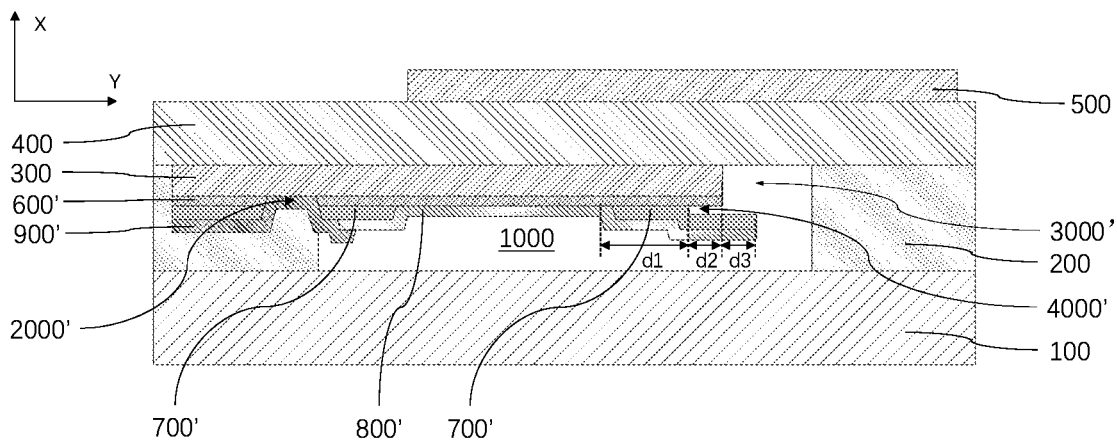
Figure 24:
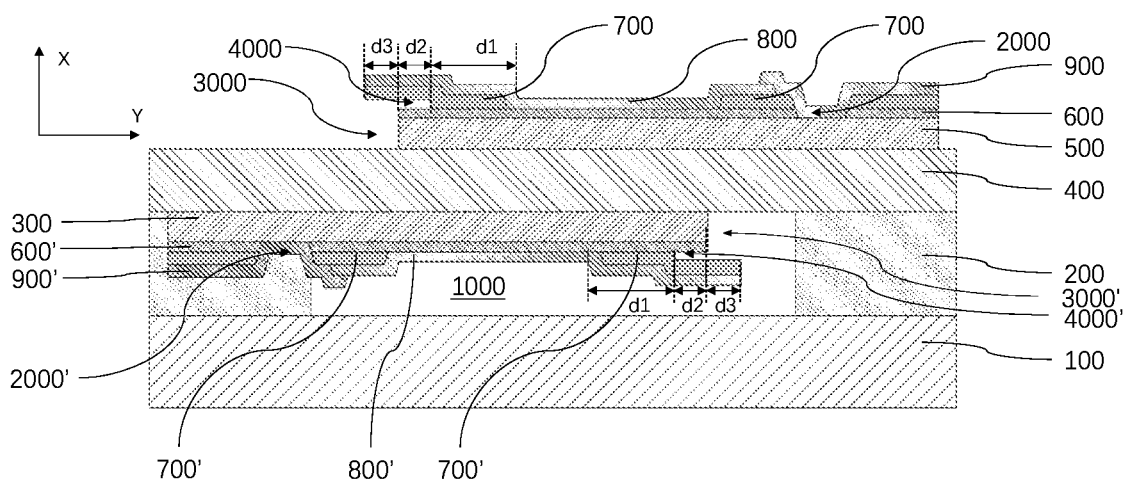

FIGS. 23 and 24 are schematic diagrams of a cross-sectional structure of a film bulk acoustic wave resonator according to some other embodiments of the present disclosure. What is different from FIG. 22 is that, the electrode edge frame structure in FIG. 23 is formed on the lower electrode layer 300, and the electrode edge frame structure in FIG. 24 is formed on both the lower electrode layer 300 and the upper electrode layer 500. Similarly, on the basis of the reference signs of the layers and gaps related to the electrode edge frame structure on the upper electrode layer 500, the reference signs of the layers and gaps related to the electrode edge frame structure on the lower electrode layer 300 are added with "'" to show the distinction. Moreover, the lower electrode layer 300 may also be provided with a lower electrode lead-out metal layer 900'. For other parts, reference can be made to the description of the embodiments above, which will not be repeatedly described here.

Figure 25:
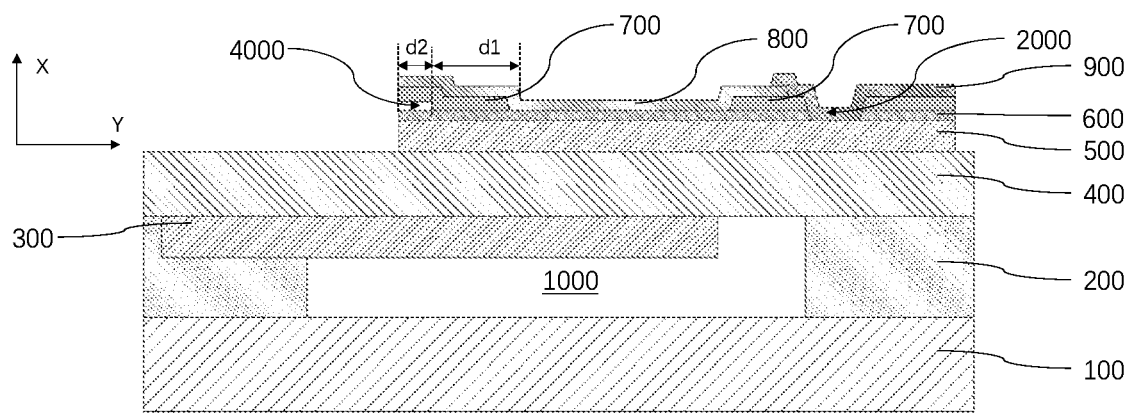

FIG. 25 is a schematic diagram of a cross-sectional structure of a film bulk acoustic wave resonator according to some embodiments of the present disclosure. What is different from the embodiment shown in FIG. 22 is that, the outer edges of the passivation layer 800 and edge convex layer 700 are aligned with the edge of the upper electrode layer 500, so the gap 3000 in FIG. 22 is not existed in FIG. 25.

Figure 26:
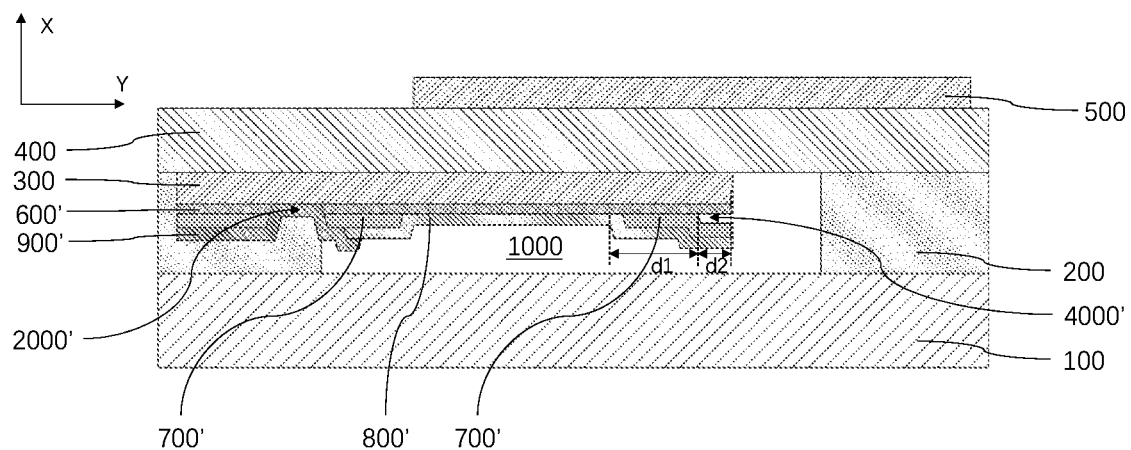
Figure 27:
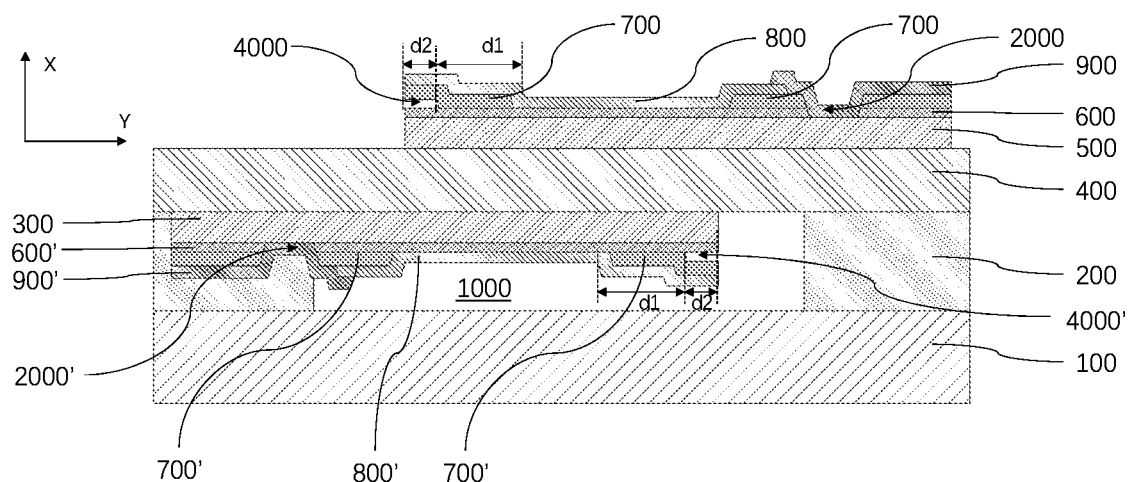

FIGS. 26 and 27 are schematic diagrams of a cross-sectional structure of a film bulk acoustic wave resonator according to some other embodiments of the present disclosure. What is different from FIG. 25 is that, the electrode edge frame structure in FIG. 26 is formed on the lower electrode layer 300, and the electrode edge frame structure in FIG. 27 is formed on both the lower electrode layer 300 and the upper electrode layer 500. Similarly, on the basis of the reference signs of the layers and gaps related to the electrode edge frame structure on the upper electrode layer 500, the reference signs of the layers and gaps related to the electrode edge frame structure on the lower electrode layer 300 are added with "'" to show the distinction. Moreover, the lower electrode layer 300 may also be provided with a lower electrode lead-out metal layer 900'. For other parts, reference can be made to the description of the embodiments above, which will not be repeatedly described here.

Figure 28:
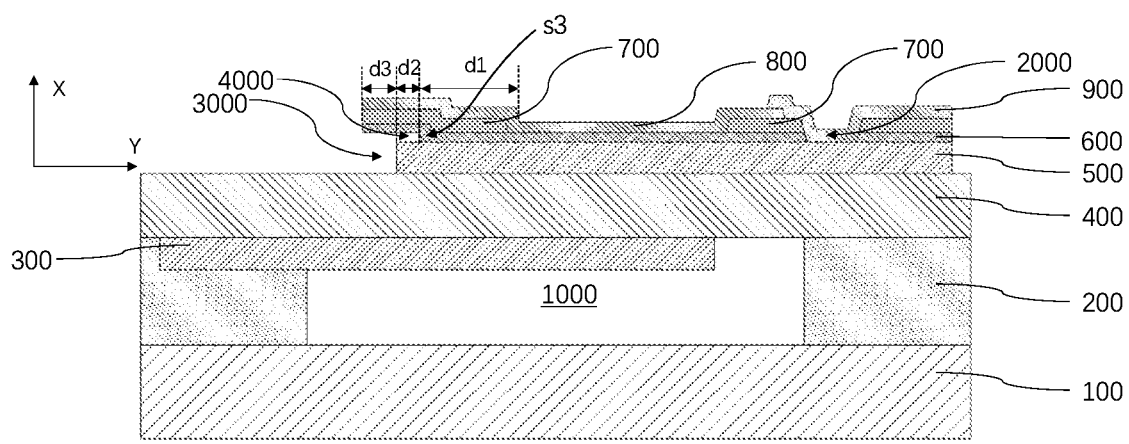

FIG. 28 is a schematic diagram of a cross-sectional structure of a film bulk acoustic wave resonator according to some embodiments of the present disclosure. What is different from the embodiment shown in FIG. 13 is that, the dielectric layer 600 is formed with a third step structure s3 at the inner side of the edge of the upper electrode layer 500, and a portion of the dielectric layer 600 between the outer edge of the dielectric layer 600 and the third step structure s3 is formed as a raised structure, thereby forming a gap 4000 between a portion of the dielectric layer 600 and the upper electrode layer 500. Moreover, the passivation layer 800, the edge convex layer 700 and the dielectric layer 600 all extend outwardly beyond the edge of the upper electrode layer 500, thereby forming a gap 3000 between another portion of the dielectric layer 600 and the piezoelectric layer 400. The gap 3000 and the gap 4000 are connected to each other, and jointly constitute a gap between the cantilever member d2, d3 and each of the upper electrode layer 500 and the piezoelectric layer 400.

Figure 29:
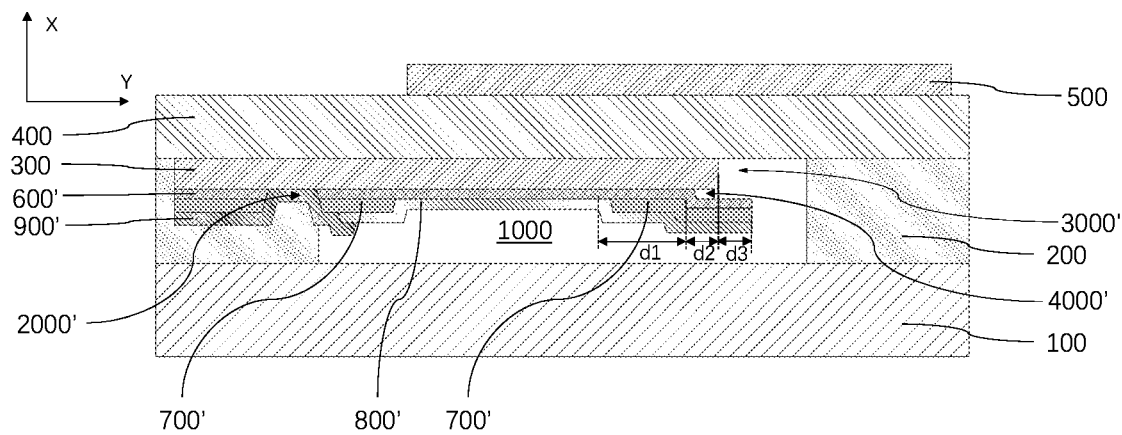
Figure 30:
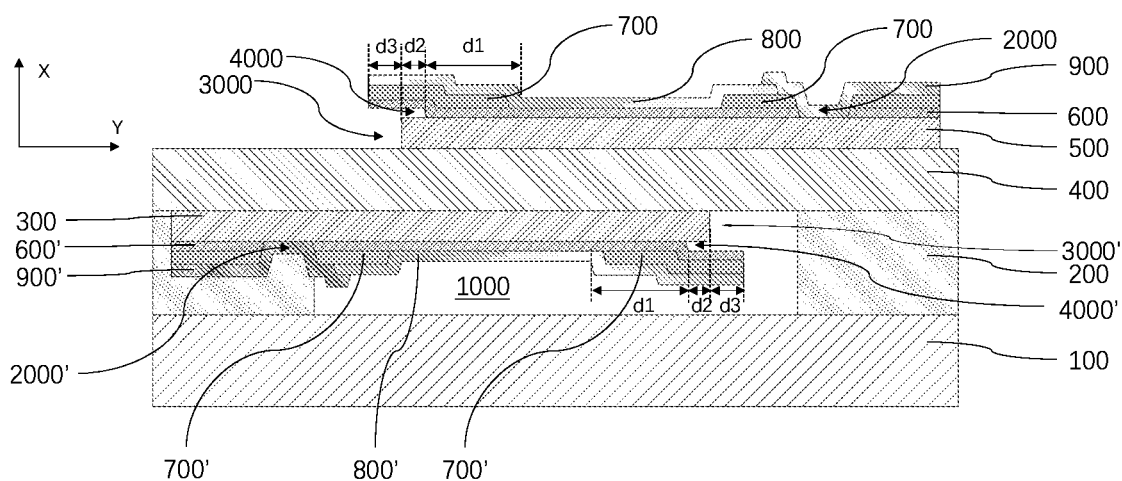

FIGS. 29 and 30 are schematic diagrams of a cross-sectional structure of a film bulk acoustic wave resonator according to some other embodiments of the present disclosure. What is different from FIG. 28 is that, the electrode edge frame structure in FIG. 29 is formed on the lower electrode layer 300, and the electrode edge frame structure in FIG. 30 is formed on both the lower electrode layer 300 and the upper electrode layer 500. Similarly, on the basis of the reference signs of the layers and gaps related to the electrode edge frame structure on the upper electrode layer 500, the reference signs of the layers and gaps related to the electrode edge frame structure on the lower electrode layer 300 are added with "'" to show the distinction. Moreover, the lower electrode layer 300 may also be provided with a lower electrode lead-out metal layer 900'. For other parts, reference can be made to the description of the embodiments above, which will not be repeatedly described here.

Figure 31:
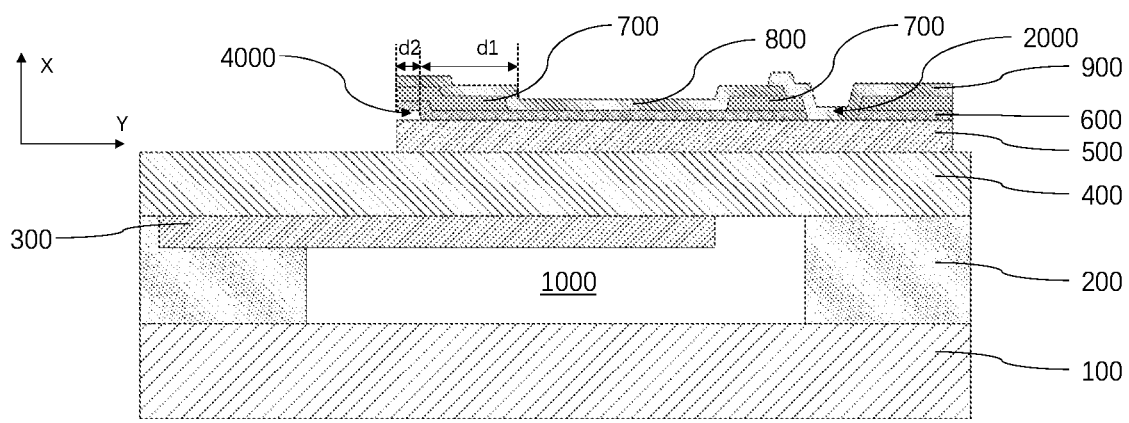

FIG. 31 is a schematic diagram of a cross-sectional structure of a film bulk acoustic wave resonator according to some embodiments of the present disclosure. What is different from the embodiment shown in FIG. 28 is that, the outer edges of the passivation layer 800, the edge convex layer 700 and the dielectric layer 600 are aligned with the edge of the upper electrode layer 500, so the gap 3000 in FIG. 28 is not existed in FIG. 31.

Figure 32:
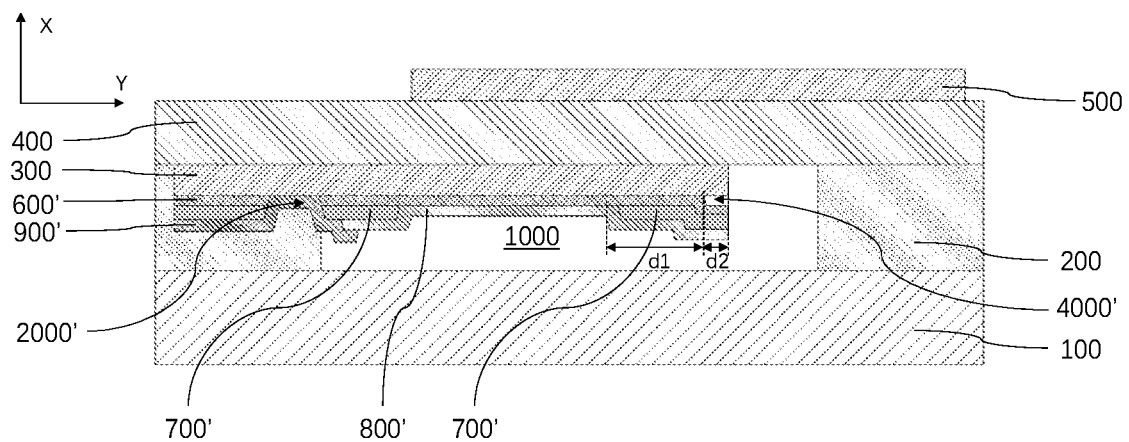
Figure 33:
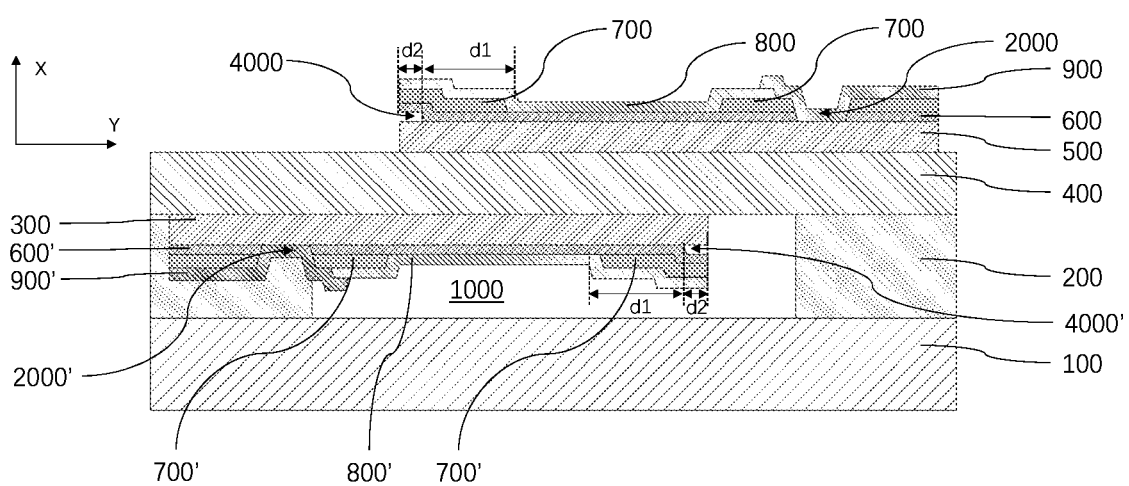

FIGS. 32 and 33 are schematic diagrams of a cross-sectional structure of a film bulk acoustic wave resonator according to some other embodiments of the present disclosure. What is different from FIG. 31 is that, the electrode edge frame structure in FIG. 32 is formed on the lower electrode layer 300, and the electrode edge frame structure in FIG. 33 is formed on both the lower electrode layer 300 and the upper electrode layer 500. Similarly, on the basis of the reference signs of the layers and gaps related to the electrode edge frame structure on the upper electrode layer 500, the reference signs of the layers and gaps related to the electrode edge frame structure on the lower electrode layer 300 are added with "'" to show the distinction. Moreover, the lower electrode layer 300 may also be provided with a lower electrode lead-out metal layer 900'. For other parts, reference can be made to the description of the embodiments above, which will not be repeatedly described here.

Figure 34:
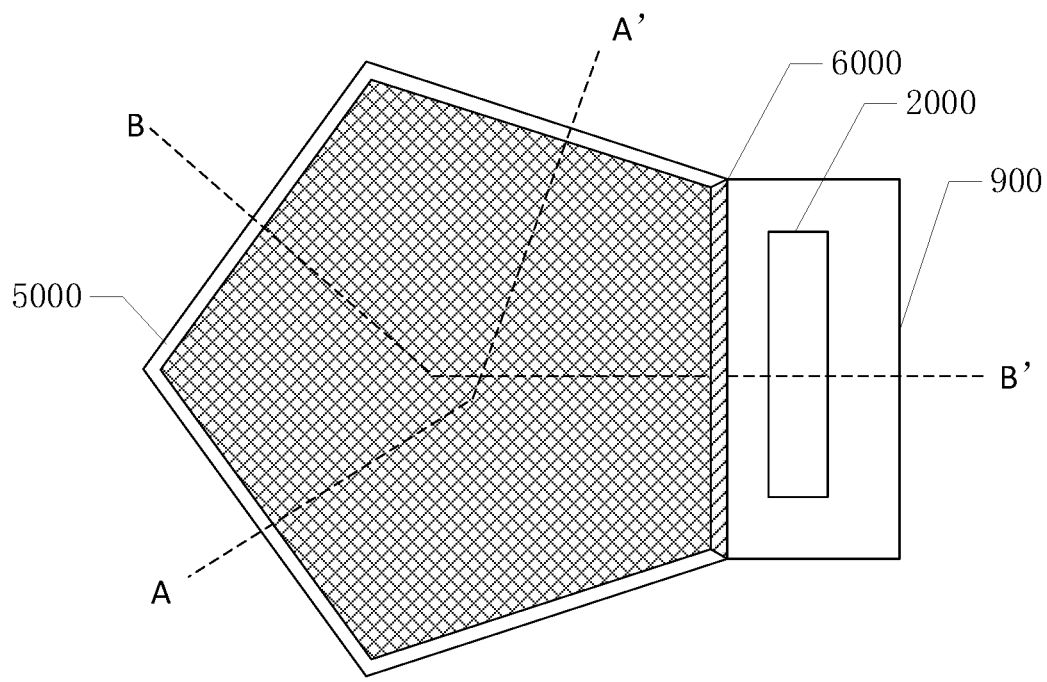
FIG. 34 is a plan view of a bulk acoustic wave resonator according to some embodiments of the present disclosure.

FIG. 34 is a schematic diagram of a planar structure of a surface of an upper electrode layer in a film bulk acoustic wave resonator according to some embodiments of the present disclosure. It should be noted that, the cross-sectional views of the embodiments shown in FIGS. 1-12 are cross-sectional views taken along the broken line AA', and the cross-sectional views of the embodiments shown in FIGS. 15-33 are cross-sectional views taken along the broken line BB'. At a position where the broken line passes through the electrode edge frame structure, the broken line is approximately perpendicular to the edge of the corresponding electrode layer, so that the cross-sectional structure of the electrode edge frame structure can be better presented. For example, a portion of the broken line passing through the electrode edge frame structure extends along the above-mentioned second direction Y. As shown in FIG. 34, the piezoelectric resonance layer of the film bulk acoustic wave resonator has, for example, an irregular pentagonal shape, in which at least one edge needs to be provided with an upper electrode lead-out metal layer to electrically connect the upper electrode layer to an external input or control device. For example, the electrode edge frame structure 5000 in FIG. 34 is arranged at four edges of the pentagonal-shaped upper electrode layer. The electrode edge frame structure 5000 here may include any one of the electrode edge frame structures in the embodiments above. For example, the electrode edge frame structure 5000 includes a convex structure and a cantilever member. Moreover, the electrode edge frame structure 5000 also includes a gap formed between the cantilever member and at least one of the piezoelectric layer and the upper electrode layer. As shown in FIG. 34, the electrode edge frame structure is arranged at four edges of the upper electrode layer. At one edge where an electrode lead-out metal layer is provided, the above-described electrode edge frame structure is not provided but the above-described edge convex layer 700 is still provided. Therefore, this edge is also provided with a convex structure similar to that in the electrode edge frame structure provided at other edges, and the convex structure may include an edge convex layer 700 and a passivation layer 800 and may further include a dielectric layer 600. That is, at the edge where an electrode lead-out structure is provided, an electrode lead-out side convex lamination 6000 is arranged on the upper electrode layer, and a cross-sectional structure of the electrode lead-out side convex lamination 6000 is the same as that of the convex structure of the electrode edge frame structure. For example, the type and the number of the layers included in the electrode lead-out side convex lamination 6000 are the same as those of the convex structure in the electrode edge frame structure. Moreover, although the embodiment above has been described with reference to the case where the electrode layer has a pentagonal shape and the electrode lead-out metal layer is arranged at one of the edges, the embodiments according to the present disclosure are not limited to this, and the planar shape of the electrode layer may be other polygonal shapes and the number of the edges where the electrode lead-out metal layer is provided may be two or more.

It can be seen in conjunction with FIG. 15 and FIG. 34 that, the upper electrode lead-out layer 900 is electrically connected with the upper electrode layer through the via hole 2000 in the dielectric layer 600. It should be explained that, at the electrode lead-out side, in the case where a dielectric layer is provided, the electrode lead-out layer 900 needs to be connected through a via hole in the dielectric layer 600, as shown in FIG. 34. However, in the absence of the dielectric layer 600, correspondingly, the via hole 2000 is not necessary. Referring to FIGS. 13 and 34, the edge convex layer 700 in the electrode lead-out side convex lamination 6000 and the edge convex layer 700 in the convex structure can be connected to each other to form an annular structure.

It should be explained that, although not shown in the figures, the lower electrode layer may also be provided with a lower electrode lead-out metal layer for electrode lead-out. For example, the lower electrode lead-out metal layer and the upper electrode lead-out metal layer may be arranged at different edges of the piezoelectric resonance layer, for example, at edges of the piezoelectric resonance layer opposite to each other. Moreover, the side of the lower electrode layer may also have various structures corresponding to those at the side of the upper electrode layer, which will not be repeatedly described here.

For example, in the embodiments above, the electrode lead-out layer 900 arranged at the electrode lead-out side can be electrically connected with both the edge convex layer 700 and the upper electrode layer 500. In the case where the electrode edge frame structure is arranged on the lower electrode layer 300, the electrode lead-out layer 900' may be connected with both the edge convex layer 700' and the lower electrode layer 300.

The materials for various layers in the film bulk acoustic wave resonator are not particularly limited in the embodiments of the present disclosure. For example, the edge convex layer 700 and the upper electrode lead-out layer 900 in the embodiments above can be metal layers, for example, the edge convex layer 700 and the upper electrode lead-out layer 900 may be formed by using materials for forming electrodes, which are not particularly limited in the embodiments of the present disclosure. The dielectric layer 600 and the passivation layer 800 can be made of insulating materials such as aluminum nitride, silicon nitride, silicon oxide, silicon oxynitride and the like, and the material of the dielectric layer 600 can be the same as or different from that of the passivation layer 800. Moreover, any suitable materials in the conventional technology can be used as the materials for various layers in the piezoelectric resonance layer as well as the materials for the base substrate and the support layer, which are not particularly limited here.

Figure 35:
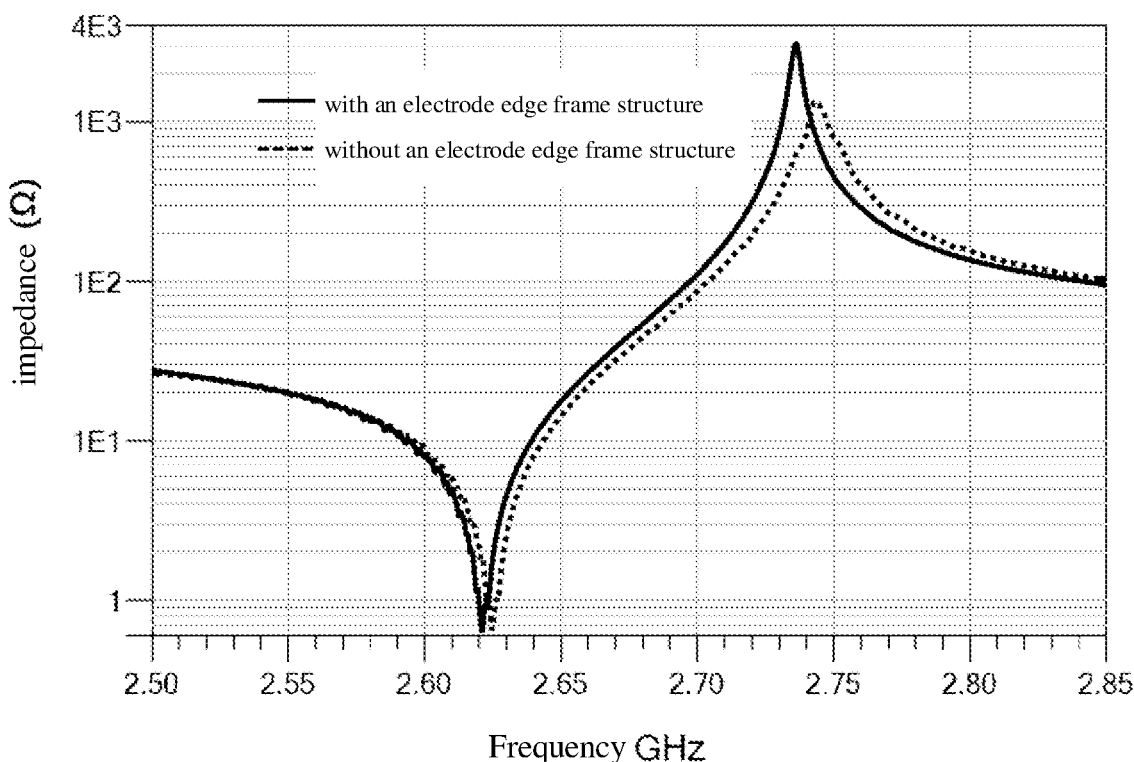
FIG. 35 is a curve chart of an impedance changed with a frequency, illustrating a comparison between a film bulk acoustic wave resonator provided with an electrode edge frame structure and a film bulk acoustic wave resonator without an electrode edge frame structure.
Figure 36:
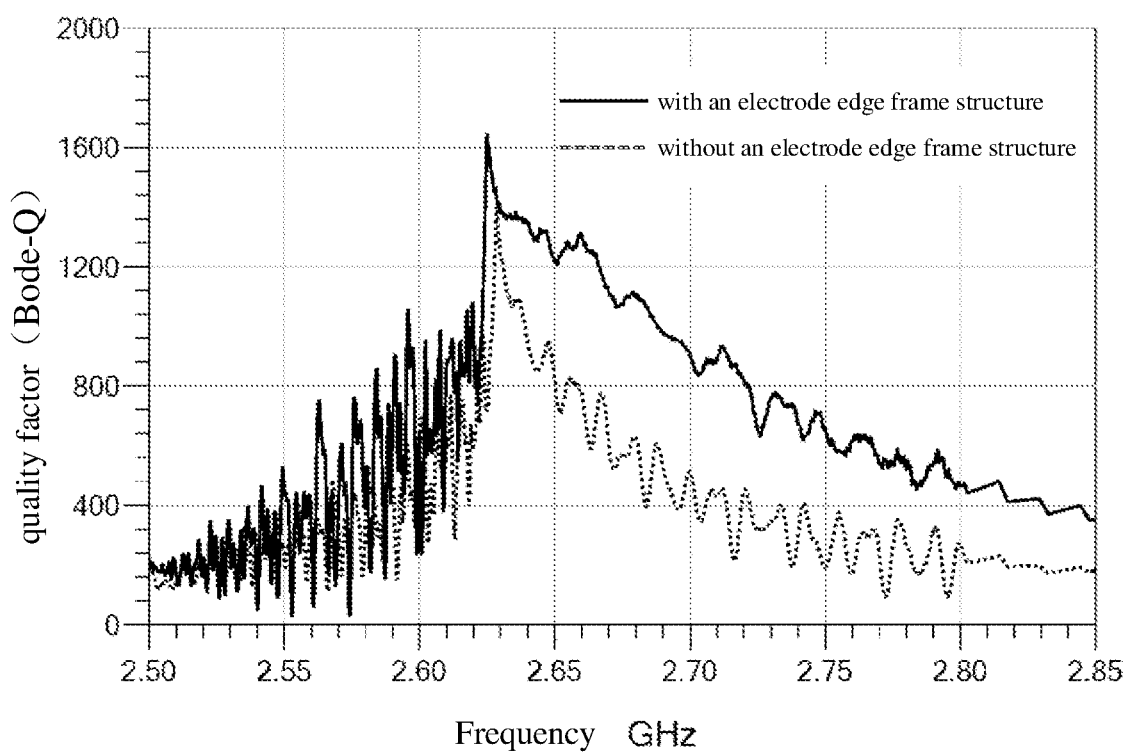
FIG. 36 is a curve chart of a quality factor changed with a frequency, illustrating a comparison between a film bulk acoustic wave resonator provided with an electrode edge frame structure and a film bulk acoustic wave resonator without an electrode edge frame structure.

In order to better illustrate the performance improvement of the bulk acoustic wave resonator in the embodiments of the present disclosure, comparative tests are conducted by using a film bulk acoustic wave resonator provided with an electrode edge frame structure in the embodiment shown in FIG. 25 and a film bulk acoustic wave resonator without the electrode edge frame structure. FIG. 35 is a curve chart of an impedance changed with a frequency illustrating a comparison between a film bulk acoustic wave resonator provided with an electrode edge frame structure and a film bulk acoustic wave resonator without an electrode edge frame structure; and FIG. 36 is a curve chart of a quality factor changed with a frequency illustrating a comparison between a film bulk acoustic wave resonator provided with an electrode edge frame structure and a film bulk acoustic wave resonator without an electrode edge frame structure. As can be seen from FIG. 35, the parallel resonance impedance Rp of the resonator is greatly increased by introducing the electrode edge frame structure described in the embodiments of the present disclosure into the film bulk acoustic wave resonator, so that the insertion loss can be reduced, which is beneficial to the improvement of the filtering performance. As can be seen from FIG. 36, the quality factor (Q) of the resonator is greatly improved by introducing the electrode edge frame structure described in the embodiments of the present disclosure into the film bulk acoustic wave resonator, so that the insertion loss can be further reduced, which is beneficial to the improvement of the filtering performance. The film bulk acoustic wave resonator of other embodiments of the present disclosure also has similar technical effects, which will not be repeatedly described here.

It should be explained that, although the embodiments above have been described with reference to the film bulk acoustic wave resonator by way of example, the embodiments of the present disclosure can also be applied to other bulk acoustic wave resonators. For example, the embodiments of the present disclosure can also be applied to a bulk acoustic wave-solidly mounted resonator (BAW-SMR). In the case of BAW-SMR, because the acoustic wave reflection structure arranged under the piezoelectric resonance layer is not a cavity but a Bragg reflection layer, the electrode edge frame structure can also be arranged only on the upper electrode layer. Therefore, the electrode edge frame structure being arranged on the electrode layer in the embodiment of the present disclosure refers to that, the electrode edge frame structure is arranged on the electrode layer with a space available for the electrode edge frame structure.

Moreover, some embodiments according to the present disclosure also provide a bulk acoustic wave filter, for example, the bulk acoustic wave filter includes at least one bulk acoustic wave resonator which can be the bulk acoustic wave resonator described in any of the embodiments above. Because the bulk acoustic wave filter according to the embodiments of the present disclosure includes at least one of the bulk acoustic wave resonators described above, it also has corresponding beneficial technical effects, which will not be repeatedly described here.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

The foregoing is only specific embodiments of the present disclosure, but the protection scope of the present disclosure is not limited thereto. Any modifications or alternations easily envisaged by one person skilled in the art within the technical scope of the present disclosure should fall within the protection scope of the present disclosure. Therefore, the protection scope of the present disclosure should be based on protection scope of the claims.

What is claimed is:

1. A bulk acoustic wave resonator, comprising:
   a piezoelectric layer;
   an electrode layer located at both sides of the piezoelectric layer; and
   an electrode edge frame structure located at an edge of the electrode layer and located at one side of the electrode layer away from the piezoelectric layer, wherein
   a direction perpendicular to the piezoelectric layer is a first direction, and a direction that is parallel to the piezoelectric layer and is perpendicular to the edge of the electrode layer where the electrode edge frame structure is arranged is a second direction; the electrode edge frame structure comprises a laminated structure, the laminated structure comprises an edge convex layer and a passivation layer which are laminated in the first direction, and the passivation layer is located at one side of the edge convex layer away from the piezoelectric layer; in the second direction, the laminated structure comprises a cantilever member and a convex structure which are connected with each other, and the cantilever member is located at one side of the convex structure away from a central portion of the electrode layer, a cantilever gap is arranged between the cantilever member and at least one of the piezoelectric layer and the electrode layer, in the second direction, an inner edge of the edge convex layer is located at an inner side of the edge of the electrode layer, and the passivation layer covers the edge convex layer to form a first step structure at the inner edge of the edge convex layer, and the convex structure is located between an inner edge of the cantilever gap and the first step structure of the passivation layer, and the cantilever member extends outwardly beyond the edge of the electrode layer to form the cantilever gap between the cantilever member and the piezoelectric layer.

2. The bulk acoustic wave resonator according to claim 1, wherein an outer edge of the edge convex layer is aligned with the edge of the electrode layer in the first direction, and the passivation layer extends outwardly beyond the edge of the electrode layer to form the cantilever gap between a portion of the passivation layer beyond the edge of the electrode layer and the piezoelectric layer.

3. The bulk acoustic wave resonator according to claim 1, wherein both the edge convex layer and the passivation layer extend outwardly beyond the edge of the electrode layer to form the cantilever gap between a portion of the edge convex layer beyond the edge of the electrode layer and the piezoelectric layer.

4. The bulk acoustic wave resonator according to claim 1, further comprising a base substrate, wherein the piezoelectric layer and the electrode layer located at both sides of the piezoelectric layer constitute at least a portion of a piezoelectric resonance layer, the piezoelectric resonance layer is arranged on the base substrate, and an acoustic wave reflection structure is arranged between the piezoelectric resonance layer and the base substrate.

5. The bulk acoustic wave resonator according to claim 4, wherein an area where the piezoelectric layer overlaps with the electrode layer located at both sides of the piezoelectric layer is an effective resonance area, and an orthographic projection of the effective resonance area on the base substrate falls within an orthographic projection of the acoustic wave reflection structure on the base substrate, an orthographic projection of the cantilever gap on the base substrate is located within the orthographic projection of the acoustic wave reflection structure on the base substrate.

6. The bulk acoustic wave resonator according to claim 4, wherein the acoustic wave reflection structure comprises a cavity, and the bulk acoustic wave resonator further comprises a support layer formed on the base substrate, the base substrate and the support layer enclose and delimit the cavity, the piezoelectric resonance layer is formed at one side of the cavity away from the base substrate, the electrode layer facing the cavity is a first electrode layer and the electrode layer facing away from the cavity is a second electrode layer, and the electrode edge frame structure is formed on at least one of the first electrode layer and the second electrode layer.

7. A bulk acoustic wave filter, comprising at least one bulk acoustic wave resonator, wherein the at least one bulk acoustic wave resonator is the bulk acoustic wave resonator according to claim 1.

8. A bulk acoustic wave resonator, comprising:
a piezoelectric layer;
an electrode layer located at both sides of the piezoelectric layer; and
an electrode edge frame structure located at an edge of the electrode layer and located at one side of the electrode layer away from the piezoelectric layer, wherein
a direction perpendicular to the piezoelectric layer is a first direction, and a direction that is parallel to the piezoelectric layer and is perpendicular to the edge of the electrode layer where the electrode edge frame structure is arranged is a second direction; the electrode edge frame structure comprises a laminated structure, the laminated structure comprises an edge convex layer and a passivation layer which are laminated in the first direction, and the passivation layer is located at one side of the edge convex layer away from the piezoelectric layer; in the second direction, the laminated structure comprises a cantilever member and a convex structure which are connected with each other, and the cantilever member is located at one side of the convex structure away from a central portion of the electrode layer, a cantilever gap is arranged between the cantilever member and at least one of the piezoelectric layer and the electrode layer, in the second direction, an inner edge of the edge convex layer is located at an inner side of the edge of the electrode layer, and the passivation layer covers the edge convex layer to form a first step structure at the inner edge of the edge convex layer, and the convex structure is located between an inner edge of the cantilever gap and the first step structure of the passivation layer, and the laminated structure further comprises a dielectric layer between the edge convex layer and the electrode layer, and the dielectric layer is located at least in the convex structure of the laminated structure.

9. The bulk acoustic wave resonator according to claim 8, wherein the dielectric layer, the edge convex layer and the passivation layer all extend outwardly beyond the edge of the electrode layer to form the cantilever gap between a portion of the dielectric layer beyond the edge of the electrode layer and the piezoelectric layer.

10. The bulk acoustic wave resonator according to claim 8, wherein both the edge convex layer and the passivation layer extend outwardly beyond the edge of the electrode layer, and an outer edge of the dielectric layer and the edge of the electrode layer are aligned in the first direction to form the cantilever gap between a portion of the edge convex layer beyond the edge of the electrode layer and the piezoelectric layer.

11. The bulk acoustic wave resonator according to claim 8, wherein the passivation layer extends outwardly beyond the edge of the electrode layer, and an outer edge of the dielectric layer and an outer edge of the edge convex layer are aligned with the edge of the electrode layer in the first direction to form the cantilever gap between a portion of the passivation layer beyond the edge of the electrode layer and the piezoelectric layer.

12. The bulk acoustic wave resonator according to claim 8, wherein a second step structure is formed between an outer edge of the edge convex layer and the inner edge of the edge convex layer, and an outer edge of the dielectric layer and the edge of the electrode layer are aligned in the first direction to form a first gap between the dielectric layer and at least a portion of the edge convex layer located between the outer edge of the edge convex layer and the second step structure, and the first gap is at least a portion of the cantilever gap.

13. The bulk acoustic wave resonator according to claim 12, wherein the edge convex layer and the passivation layer extend outwardly beyond the edge of the electrode layer to form a second gap between a portion of the edge convex layer beyond the edge of the electrode layer and the piezoelectric layer, the second gap is connected with the first gap and the second gap is a portion of the cantilever gap.

14. The bulk acoustic wave resonator according to claim 8, wherein the dielectric layer is formed with a third step structure at the inner side of the edge of the electrode layer to form a first gap between the electrode layer and at least a portion of the dielectric layer located between an outer edge of the dielectric layer and the third step structure, and the first gap is at least a portion of the cantilever gap.

15. The bulk acoustic wave resonator according to claim 14, wherein the dielectric layer, the edge convex layer and the passivation layer all extend outwardly beyond the edge of the electrode layer to form a second gap between a portion of the dielectric layer beyond the edge of the electrode layer and the piezoelectric layer, the second gap is connected with the first gap and the second gap is a portion of the cantilever gap.

16. The bulk acoustic wave resonator according to claim 8, wherein a planar shape of the electrode layer provided with the electrode edge frame structure is a polygon shape, the polygon shape comprises M edges, and the electrode edge frame structure is formed at each of M-N edges,
the bulk acoustic wave resonator further comprises an electrode lead-out layer located at each of N edges of the electrode layer where the electrode edge frame structure is not arranged, and the dielectric layer comprises a via hole, the electrode lead-out layer is electrically connected with the electrode layer through the via hole in the dielectric layer, where M and N both are positive integers, and N is smaller than M.

17. A bulk acoustic wave resonator, comprising:
a piezoelectric layer;
an electrode layer located at both sides of the piezoelectric layer; and
an electrode edge frame structure located at an edge of the electrode layer and located at one side of the electrode layer away from the piezoelectric layer, wherein a direction perpendicular to the piezoelectric layer is a first direction, and a direction that is parallel to the piezoelectric layer and is perpendicular to the edge of the electrode layer where the electrode edge frame structure is arranged is a second direction; the electrode edge frame structure comprises a laminated structure, the laminated structure comprises an edge convex layer and a passivation layer which are laminated in the first direction, and the passivation layer is located at one side of the edge convex layer away from the piezoelectric layer; in the second direction, the laminated structure comprises a cantilever member and a convex structure which are connected with each other, and the cantilever member is located at one side of the convex structure away from a central portion of the electrode layer,
a cantilever gap is arranged between the cantilever member and at least one of the piezoelectric layer and the electrode layer,
in the second direction, an inner edge of the edge convex layer is located at an inner side of the edge of the electrode layer, and the passivation layer covers the edge convex layer to form a first step structure at the inner edge of the edge convex layer, and the convex structure is located between an inner edge of the cantilever gap and the first step structure of the passivation layer, and
a second step structure is formed between an outer edge of the edge convex layer and the inner edge of the edge convex layer, so that a first gap is formed between the electrode layer and at least a portion of the edge convex layer located between the outer edge of the edge convex layer and the second step structure, and the first gap is at least a portion of the cantilever gap.

18. The bulk acoustic wave resonator according to claim 17, wherein the outer edge of the edge convex layer and an outer edge of the passivation layer are aligned with the edge of the electrode layer in the first direction.

19. The bulk acoustic wave resonator according to claim 17, wherein the edge convex layer and the passivation layer extend outwardly beyond the edge of the electrode layer, so that a second gap is formed between a portion of the edge convex layer beyond the edge of the electrode layer and the piezoelectric layer, the first gap is connected with the second gap, and the second gap is a portion of the cantilever gap.

* * * * *